(12) United States Patent
Bathurst et al.

(10) Patent No.: US 9,624,100 B2
(45) Date of Patent: Apr. 18, 2017

(54) MICRO PICK UP ARRAY PIVOT MOUNT WITH INTEGRATED STRAIN SENSING ELEMENTS

(71) Applicant: LuxVue Technology Corporation, Santa Clara, CA (US)

(72) Inventors: Stephen P. Bathurst, Lafayette, CA (US); Paul Argus Parks, Austin, TX (US); Nile Alexander Light, Livermore, CA (US)

(73) Assignee: Apple Inc., Cupertino, CA (US)

( * ) Notice: Subject to any disclaimer, the term of this patent is extended or adjusted under 35 U.S.C. 154(b) by 344 days.

(21) Appl. No.: 14/303,483

(22) Filed: Jun. 12, 2014

(65) Prior Publication Data

US 2015/0360940 A1  Dec. 17, 2015

(51) Int. Cl.
| | |
|---|---|
| *H01L 21/683* | (2006.01) |
| *B81C 99/00* | (2010.01) |
| *B25J 7/00* | (2006.01) |
| *B25J 15/00* | (2006.01) |
| *H02N 13/00* | (2006.01) |

(52) U.S. Cl.
CPC ............ *B81C 99/002* (2013.01); *B25J 7/00* (2013.01); *B25J 15/0085* (2013.01); *B81B 2203/0163* (2013.01); *H01L 21/6831* (2013.01); *H02N 13/00* (2013.01); *Y10T 74/20006* (2015.01)

(58) Field of Classification Search
USPC ....................................................... 361/234
See application file for complete search history.

(56) References Cited

U.S. PATENT DOCUMENTS

| | | |
|---|---|---|
| 3,717,743 A | 2/1973 | Costello |
| 3,935,986 A | 2/1976 | Lattari et al. |
| 5,131,582 A | 7/1992 | Kaplan et al. |
| 5,378,926 A | 1/1995 | Chi et al. |
| 5,435,857 A | 7/1995 | Han et al. |

(Continued)

FOREIGN PATENT DOCUMENTS

| | | |
|---|---|---|
| CN | 101663035 A | 10/2010 |
| CN | 101863035 A | 10/2010 |

(Continued)

OTHER PUBLICATIONS

Asano, Kazutoshi, et al., "Fundamental Study of an Electrostatic Chuck for Silicon Water Handeling" IEEE Transactions on Industry Applications, vol. 38, No. 3, May/Jun. 2002, pp. 840-845.

(Continued)

*Primary Examiner* — Danny Nguyen
(74) *Attorney, Agent, or Firm* — Blakely, Sokoloff, Taylor & Zafman LLP

(57) ABSTRACT

Systems and methods for aligning a transfer head assembly with a substrate are disclosed. In an embodiment a pivot mount is used for generating a feedback signal in a closed-loop motion control system. In an embodiment, the pivot mount includes a plurality of spring arms, with each spring arm including a switch-back along an axial length of the spring arm such that a pair of first and second lengths of the spring arm are immediately adjacent the switch-back and are parallel to each other. A first strain sensing element is located at the first length, and a second strain sensing element is located at the second length.

18 Claims, 24 Drawing Sheets

(56) References Cited

U.S. PATENT DOCUMENTS

| | | |
|---|---|---|
| 5,592,358 A | 1/1997 | Shamouilian et al. |
| 5,740,956 A | 4/1998 | Seo et al. |
| 5,794,839 A | 8/1998 | Kimura et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,080,650 A | 6/2000 | Edwards |
| 6,081,414 A | 6/2000 | Flanigan et al. |
| 6,335,263 B1 | 1/2002 | Cheung et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,683,368 B1 | 1/2004 | Mostafazadeh |
| 6,786,390 B2 | 9/2004 | Yang et al. |
| 6,878,607 B2 | 4/2005 | Inoue et al. |
| 6,918,530 B2 | 7/2005 | Shinkai et al. |
| 7,033,842 B2 | 4/2006 | Haji et al. |
| 7,148,127 B2 | 12/2006 | Oohata et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,439,549 B2 | 10/2008 | Marchl et al. |
| 7,585,703 B2 | 9/2009 | Matsumura et al. |
| 7,628,309 B1 | 12/2009 | Eriksen et al. |
| 7,714,336 B2 | 5/2010 | Imai |
| 7,723,764 B2 | 5/2010 | Oohata et al. |
| 7,795,629 B2 | 9/2010 | Watanabe et al. |
| 7,797,820 B2 | 9/2010 | Shida et al. |
| 7,838,410 B2 | 11/2010 | Hirao et al. |
| 7,854,365 B2 | 12/2010 | Li et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,972,875 B2 | 7/2011 | Rogers et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,076,670 B2 | 12/2011 | Slater et al. |
| 8,186,568 B2 | 5/2012 | Coronel et al. |
| 8,333,860 B1 | 12/2012 | Bibl et al. |
| 8,349,116 B1 | 1/2013 | Bibl et al. |
| 8,426,227 B1 | 4/2013 | Bibl et al. |
| 8,518,204 B2 | 8/2013 | Hu et al. |
| 9,391,042 B2 * | 7/2016 | Golda .................. H01L 24/75 |
| 2001/0029088 A1 | 10/2001 | Odajima et al. |
| 2002/0076848 A1 | 6/2002 | Spooner et al. |
| 2003/0010975 A1 | 1/2003 | Gibb et al. |
| 2003/0177633 A1 | 9/2003 | Haji et al. |
| 2004/0100164 A1 | 5/2004 | Murata et al. |
| 2004/0266048 A1 | 12/2004 | Platt et al. |
| 2005/0224822 A1 | 10/2005 | Liu |
| 2005/0232728 A1 | 10/2005 | Rice et al. |
| 2006/0038291 A1 | 2/2006 | Chung et al. |
| 2006/0055035 A1 | 3/2006 | Lin et al. |
| 2006/0065905 A1 | 3/2006 | Eisert et al. |
| 2006/0157721 A1 | 7/2006 | Tran et al. |
| 2006/0160276 A1 | 7/2006 | Brown et al. |
| 2006/0214299 A1 | 9/2006 | Fairchild et al. |
| 2007/0048902 A1 | 3/2007 | Hiatt et al. |
| 2007/0166851 A1 | 7/2007 | Tran et al. |
| 2007/0194330 A1 | 8/2007 | Ibbetson et al. |
| 2007/0284604 A1 | 12/2007 | Slater et al. |
| 2008/0048206 A1 | 2/2008 | Lee et al. |
| 2008/0150134 A1 | 6/2008 | Shinkai et al. |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0205027 A1 | 8/2008 | Coronel et al. |
| 2008/0283190 A1 | 11/2008 | Papworth et al. |
| 2008/0283849 A1 | 11/2008 | Imai |
| 2008/0303038 A1 | 12/2008 | Grotsch et al. |
| 2009/0068774 A1 | 3/2009 | Slater et al. |
| 2009/0072382 A1 | 3/2009 | Guzek |
| 2009/0146303 A1 | 6/2009 | Kwon |
| 2009/0242918 A1 | 10/2009 | Edmond et al. |
| 2009/0303713 A1 | 12/2009 | Chang et al. |
| 2009/0314991 A1 | 12/2009 | Cho et al. |
| 2010/0052004 A1 | 3/2010 | Slater et al. |
| 2010/0105172 A1 | 4/2010 | Li et al. |
| 2010/0123164 A1 | 5/2010 | Suehiro et al. |
| 2010/0176415 A1 | 7/2010 | Lee et al. |
| 2010/0188794 A1 | 7/2010 | Park et al. |
| 2010/0200884 A1 | 8/2010 | Lee et al. |
| 2010/0203659 A1 | 8/2010 | Akaike et al. |
| 2010/0203661 A1 | 8/2010 | Hodota |
| 2010/0213471 A1 | 8/2010 | Fukasawa et al. |
| 2010/0214777 A1 | 8/2010 | Suehiro et al. |
| 2010/0248484 A1 | 9/2010 | Bower et al. |
| 2010/0257934 A1 * | 10/2010 | Zhang ............... G01C 19/5719 73/504.12 |
| 2010/0276726 A1 | 11/2010 | Cho et al. |
| 2011/0001145 A1 | 1/2011 | Park |
| 2011/0003410 A1 | 1/2011 | Tsay et al. |
| 2011/0049540 A1 | 3/2011 | Wang et al. |
| 2011/0132655 A1 | 6/2011 | Horiguchi et al. |
| 2011/0132656 A1 | 6/2011 | Horiguchi et al. |
| 2011/0143467 A1 | 6/2011 | Xiong et al. |
| 2011/0147760 A1 | 6/2011 | Ogihara et al. |
| 2011/0151602 A1 | 6/2011 | Speier |
| 2011/0159615 A1 | 6/2011 | Lai |
| 2011/0210357 A1 | 9/2011 | Kaiser et al. |
| 2011/0244611 A1 | 10/2011 | Kim |
| 2011/0291134 A1 | 12/2011 | Kang |
| 2011/0297914 A1 | 12/2011 | Zheng et al. |
| 2011/0312131 A1 | 12/2011 | Renavikar et al. |
| 2012/0018494 A1 | 1/2012 | Jang et al. |
| 2012/0064642 A1 | 3/2012 | Huang et al. |
| 2012/0134065 A1 | 5/2012 | Furuya et al. |
| 2013/0019996 A1 | 1/2013 | Routledge |
| 2013/0038416 A1 | 2/2013 | Arai et al. |
| 2013/0130440 A1 | 5/2013 | Hu et al. |
| 2013/0134591 A1 | 5/2013 | Sakamoto et al. |
| 2013/0161682 A1 | 6/2013 | Liang et al. |
| 2014/0071580 A1 | 3/2014 | Higginson et al. |

FOREIGN PATENT DOCUMENTS

| | | |
|---|---|---|
| DE | 10 2007 033000 A1 | 1/2009 |
| JP | 61-265218 A | 11/1986 |
| JP | 07-060675 A | 3/1995 |
| JP | 11-142878 | 5/1999 |
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-095944 A | 3/2004 |
| JP | 2008-200821 A | 9/2008 |
| JP | 2010-056458 A | 3/2010 |
| JP | 2010-161212 A | 7/2010 |
| JP | 2010-186829 A | 8/2010 |
| JP | 2011-181834 A | 9/2011 |
| KR | 10-0610632 B1 | 8/2006 |
| KR | 10-2007-0042214 A | 4/2007 |
| KR | 10-2007-0093091 A | 9/2007 |
| KR | 10-0973928 B1 | 8/2010 |
| KR | 10-1001454 B1 | 12/2010 |
| KR | 10-2007-0006885 A | 1/2011 |
| KR | 10-2011-0084888 A | 7/2011 |
| WO | WO 00-67543 A1 | 11/2000 |
| WO | WO 2005-099310 A2 | 10/2005 |

(56) References Cited

FOREIGN PATENT DOCUMENTS

| WO | WO 2008-052594 A1 | 5/2008 |
|---|---|---|
| WO | WO 2011/123285 | 10/2011 |
| WO | WO 2014/050586 A1 | 4/2014 |

OTHER PUBLICATIONS

Bower, C.A., et al., "Active-Matrix OLED Display Backplanes Using Transfer-Printed Microscale Intergrated Circuits", IEEE, 2010 Electronic Components and Technology Conference, pp. 1339-1343.

"Characteristics of electrostatic Chuck(ESC)" Advanced Materials Research Group, New Technology Research Laboratory, 2000, pp. 51-53 accessed at http://www.socnb.com/report/ptech_e.pdf.

Guerre, Roland, et al, "Selective Transfer Technology for Microdevice Distribution"Journal of Microelectromechanical Systems, vol. 17, No. 1, Feb. 2008, pp. 157-165.

Han, Min-Koo, "AM backplane for AMOLED"Proc. of ASID '06, Oct. 8-12, New Delhi, pp. 53-58.

Harris, Jonathan H, "Sintered Aluminum Nitride Ceramics for High-Power Electronic Applications"Journal of the Minerals, Metals and Materials Society, vol. 50, No. 6, Jun. 1998, pp. 56.

Horwitz, Chris M., "Electrostatic Chucks: Frequently Asked Questions"Electrogrip, 2006, 10 pgs, accessed at www.electrogrip.com.

Hossick-Schott, Joachim, "Prospects for the ultimate energy density of oxide-based capacitor anodes" Proceedings of CARTS Europe, Barcelona, Spain, 2007, 10 pgs.

Lee, San Youl, et al., "Water-level fabrication of GAN-based vertical light-emitting diodes using a multi-functional bonding material system"Semicond. Sci. Technol. 24, 2009, 4 pgs.

"Major Research Thrust: Expitaxial Layer Transfer by Laser Lift-off" Purdue University, Heterogenous Integration Research Group, accessed at http://engineering.purdue.edu/HetInt/project_epitaxial_layer_transfer_lio.htm, last updated Aug. 2003.

Mei, Zequn, et al., "Low-Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

PCT International Search Report and Written Opinion for International Application No. PCT/US2015/032292, mailed Sep. 23, 2015, 10 pages.

PCT International Search Report and Written Opinion for International Application No. PCT/US2014/016418, mailed May 27, 2014, 10 pages.

* cited by examiner

MICRO PICK UP ARRAY PIVOT MOUNT WITH INTEGRATED STRAIN SENSING ELEMENTS

BACKGROUND

Field

The present invention relates to micro devices. More particularly embodiments relate to a micro pick up array pivot mount with integrated strain sensing elements for aligning an electrostatic transfer head array with a target substrate.

Background Information

The feasibility of commercializing miniature devices such as radio frequency (RF) microelectromechanical systems (MEMS) microswitches, light-emitting diode (LED) display systems, and MEMS or quartz-based oscillators is largely constrained by the difficulties and costs associated with manufacturing those devices. Miniaturized device manufacturing processes typically include processes in which miniaturized devices are transferred from one wafer to another. In one such implementation, a transfer wafer may pick up an array of miniaturized devices from a donor wafer and bond the miniaturized devices to a receiving wafer. Methods and apparatuses for aligning two flat surfaces in a parallel orientation have been described, and may be applied to miniaturized device transfer.

SUMMARY

A pivot mount and transfer tool are described. In an embodiment a pivot mount includes a pivot platform, a base, and a plurality of spring arms. Each spring arm is fixed to the pivot platform at a corresponding inner root, and fixed to the base at a corresponding outer root. Each spring arm also includes one or more switch-backs along an axial length of the spring arm such that a pair of first and second lengths of the spring arm immediately adjacent a switch-back are parallel to each other. A first strain sensing element may be located at the first length of the spring arm, and a second strain sensing element may be located at the second length of the spring arm. Likewise, a first reference gage may be located adjacent the first strain sensing element at the first length, and a second reference gage may be located adjacent the second strain sensing element at the second length. For example, the strain sensing elements may be strain gages that are bonded to the spring arm, deposited on the spring arm, or doped regions in the spring arm. In an embodiment, the plurality of spring arms includes three or more spring arms. In an embodiment, the one or more switch-backs includes an inner switch-back along an inner length of a spring arm, and an outer-switchback along an outer length of the spring arm.

In an embodiment, the inner root is perpendicular to an inner length of the spring arm extending from the pivot platform, and the outer root is perpendicular to an outer length of the spring arm extending from the base. In an embodiment, the pivot platform is movable relative to the base in a direction orthogonal to a contact surface of the pivot platform, and movement of the pivot platform in the direction orthogonal to the contact surface causes a normal strain at the surface of the spring arm that is characterized as being parallel to the axial length of the spring arm at the first and second lengths of the spring arm. In an embodiment, the normal strain at the surface of the spring arm is of opposite sign on the first and second lengths of the spring arm.

In an embodiment, a pivot mount includes a pivot platform with a plurality of compliant voltage contacts, a base, and a plurality of spring arms in which each spring arm is fixed to the pivot platform at a corresponding inner root and fixed to the base at a corresponding outer root. In an embodiment, each compliant voltage contact is at least partially formed by a channel extending through the pivot platform. The compliant voltage contacts may assume a variety of configurations including a winding contour and switch-back. In an embodiment, the pivot mount includes a clamping electrode on the pivot platform. Each compliant voltage contact may protrude from the pivot platform such that they are raised above the pivot platform and clamping electrode.

In an embodiment, any of the pivot mounts described above may be included in a transfer tool, including an articulating transfer head assembly, and a micro mick up array mounted onto the pivot platform of the pivot mount. The micro pick up array may include a plurality of electrostatic transfer heads. In an embodiment, the pivot platform includes a plurality of compliant voltage contacts as described above. The micro pick up array may include a plurality of voltage contacts arranged to mate with the plurality of compliant voltage contacts of the pivot platform. In an embodiment each electrostatic transfer head has a localized contact point characterize by a maximum dimension of 1-100 μm in both the x- and y-dimensions.

DETAILED DESCRIPTION

Figure 1:
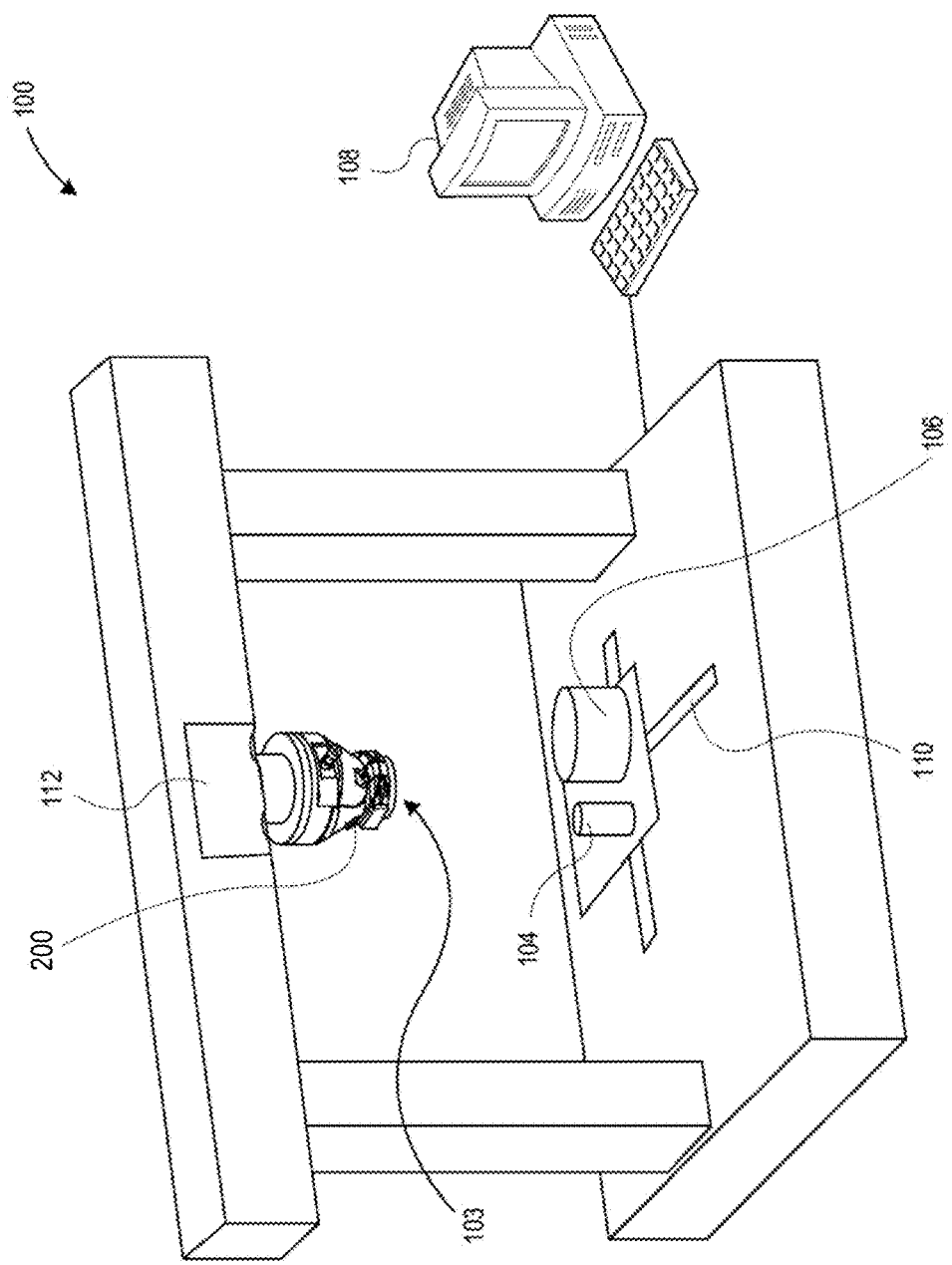
FIG. 1 is perspective view illustration of a mass transfer tool in accordance with an embodiment.

Embodiments describe a pivot mount including a base, a pivot platform, and plurality of spring arms, each spring arm including a switch-back along an axial length of the spring arm such that a pair of first and second lengths of the spring arm immediately adjacent the switch-back are parallel to each other. A first strain sensing element is located at the first length, and a second strain sensing element is located at the second length of the spring arm. In this manner, when the pivot mount is moved in a direction orthogonal to a contact surface of the pivot platform normal strains of opposite sign are created at the surface of the spring arm on the first and second lengths of each spring arm.

The pivot mount can be coupled to an articulating head assembly of a mass transfer tool for accurate and repeatable alignment in 6 spatial degrees of freedom between the transfer tool and a target substrate. When accurately aligning two planar surfaces, lateral (x and y) and rotational (θz) alignments are relatively straightforward to achieve through use of a high-precision x-y stage and rotationally-positioned substrate chucks. The remaining three degrees of freedom, θx, θy, (or, "tilt" and "tip") and z are difficult to independently control. Any changes to the tip and tilt angle necessarily change the distance z to any point not located at the center of rotation. While parallelism between two planes can be accomplished through use of a passive pivot mount, the pressure distribution between the two planar surfaces will not be centered or uniform unless the two surfaces were parallel to begin with. A transfer tool including a pivot mount in accordance with embodiments described herein may redistribute the pressure distribution to achieve a uniform pressure field. By placing strain sensing elements (strain gages) at high-strain locations on the pivot mount spring arms, a feedback signal of the position error can be generated and input to the transfer tool for operation in a closed-loop motion control system. Because strain is related to the stress state through Hooke's Law, both displacement and forces acting on the pivot mount can be known by measuring strain.

In one aspect, embodiments describe a pivot mount configuration that achieves a high strain sensing sensitivity and generates a feedback signal with a high signal to noise ratio. As a result the pivot mount can provide a position feedback signal with increased effective resolution to the transfer tool. By locating the strain sensing elements on opposite sides of switch-backs in an axial length of a spring arm, equal and opposite strain responses are measured. In this manner a strain signal for a given platform displacement may be effectively doubled. Such a configuration can also reduce noise for a given strain signal. Due to the differential sensing at the first and second lengths adjacent the switch-back the measured noise is effectively canceled. Accordingly, higher strain sensing sensitivity may be accomplished with a higher signal to noise ratio, and an increased effective resolution of the position feedback signal may be provided to the transfer tool.

In another aspect, embodiments describe pivot mount spring arm configurations that minimize the torsion applied to a spring arm at the roots where a spring arm is fixed to a pivot platform at one end and fixed to a base at another end. This creates a more uniform bending moment in the high strain regions of the spring arm with reduced strain variation and torsion in the spring arms, which allows the strain sensing elements to be located in the high strain regions near the roots. By comparison, in other configurations with spring arms that undergo both bending and torsional loading, the area of maximum strain may include both bending and torsion. Torsion in the spring arms is parasitic to surface strain sensing since it manifests as strain at the surface of the spring arm having components in both the x and y directions. Because the total strain energy distributed through the spring arms is constant for a given pivot platform displacement, the presence of strain components perpendicular to the strain sensing elements reduces the ratio of strain components that are aligned with the strain sensing elements. As a result, strain sensing elements located near areas of torsion may produce a lower effective feedback signal and sensitivity. In an embodiment, a pivot mount is arranged to create boundary conditions at the roots of the spring arms with a uniform bending moment, in which strain is substantially perpendicular to the roots and substantially parallel to strands in the strain sensing elements, which may be parallel to axial lengths of the spring arms in the high strain regions. Such a configuration directs substantially all of the strain energy from a given pivot platform displacement into strain components aligned with the strain sensing elements. As a result, higher strain may be measured and sense feedback signal strength may be increased for a given pivot platform displacement. Reduction of the torsional moment at the roots may additionally allow more freedom in stiffness requirements of the spring arms. In turn, reduced stiffness requirements allow for longer axial length of the spring arms in the same available real estate within the pivot mount, and consequently greater bending, resulting in increased normal strain at the surface of the spring arms and sense feedback signal strength.

In another aspect, reduction of the torsional moment applied to the spring arms at the roots may also increase the effectiveness of the reference gage(s) positioned adjacent the strain sensing elements. In an embodiment, each strain sensing element is located in a high strain region of a spring arm that sees only normal strain at the surface in the gage direction of the strain sensing element and sees no normal strain at the surface lateral to the gage direction. This allows the location of a reference strain gage adjacent to each strain sensing element with the result that the reference gages do not see strain caused by mechanical loading of the pivot platform. This in turn allows the reference gages to compensate for temperature variations in the system, and increase the signal to noise ratio. Since the strain sensing elements and reference gages are adjacent, they are exposed to the same temperature, meaning the thermal strain is identical in both a strain sensing element and a corresponding reference gage. Since the reference strain gages are not subjected to strain resulting from mechanical load, any strain signal they produce can be attributed to temperature (as noise), which is then subtracted as background noise from the strain measured by the adjacent strain sensing element. In an embodiment, strands in the reference gages are oriented perpendicular to strands in the strain sensing elements. In such a configuration, the normal strain at the surface of the spring arms is substantially parallel to the strands in the strain sensing elements, and perpendicular to the strands in the reference strain gages. Thus, by reducing the torsional moment and creating uniform bending moments in the spring arms in which normal strain at the surface of the spring arms is substantially perpendicular to the roots, the reference strain gages may be more accurate and a higher strain sensing sensitivity may be accomplished with a higher signal to noise ratio.

In another aspect, embodiments describe an arrangement of strain sensing elements into distributed, correlated sensors. In this manner, the loss of a strain sensing element or sensor does not prohibit use of the pivot mount, and the lifetime of the pivot mount use with a transfer tool can be extended. In an embodiment, each sensor includes one or more correlation sensors. For example, a correlated pair may each sense a same z-deflection. In another situation, a correlated pair may sense a same or equal but opposite θx, θy, (or, "tilt" and "tip"). In either situation, the loss of one of the correlated sensor may reduce the overall signal to noise ratio generated from the pivot platform, yet the remaining signal to noise ratio remains adequate for operation of the transfer tool.

In yet another aspect, embodiments describe a pivot mount with compliant voltage contacts, for providing a low contact resistance connections of the voltage contacts to a micro pick up array (MPA) that is mounted onto the pivot platform of the pivot mount. The compliant voltage contacts may protrude from the pivot platform such that they are elevated above the pivot platform, yet are compliant such that they exert a pressure upon the MPA contacts when the MPA is clamped onto the pivot mount pivot platform, for example, using an electrostatic clamp contact on the pivot mount platform.

Referring to FIG. 1, a perspective view of a mass transfer tool is shown. Mass transfer tool 100 may include a transfer head assembly 200 for picking up an array of micro devices from a carrier substrate held by a carrier substrate holder 104 and for transferring and releasing the array of micro devices onto a receiving substrate held by a receiving substrate holder 106. Embodiments of mass transfer tool 100 are described in U.S. patent application Ser. No. 13/607,031, titled "Mass Transfer Tool", filed on Sep. 7, 2012. Operation of mass transfer tool 100 and transfer head assembly 200 may be controlled at least in part by a computer 108. Computer 108 may control the operation of transfer head assembly 200 based on feedback signals received from various sensors (e.g. strain sensing elements, reference gages) located on a pivot mount. For example, transfer head assembly 200 may include an actuator assembly for adjusting an associated MPA 103 with at least three degrees of freedom, e.g., tipping, tilting, and movement in a z direction, based on feedback signals received from sensors associated with a pivot mount that carries MPA 103. Similarly, the carrier substrate holder 104 and receiving substrate holder 106 may be moved by an x-y stage 110 of mass transfer tool 100, having at least two degrees of freedom, e.g., along orthogonal axes within a horizontal plane. Additional actuators may be provided, e.g., between mass transfer tool 100 structural components and transfer head assembly 200, carrier substrate holder 104, or receiving substrate holder 106, to provide movement in the x, y, or z direction for one or more of those sub-assemblies. For example, a gantry 112 may support transfer head assembly 200 and move transfer head assembly 200 along an upper beam, e.g., in a direction parallel to an axis of motion of x-y stage 110. Thus, an array of electrostatic transfer heads on MPA 103, supported by transfer head assembly 200, and an array of micro devices supported by a carrier substrate held by carrier substrate holder 104 may be precisely moved relative to each other within all three spatial dimensions.

Figure 2:
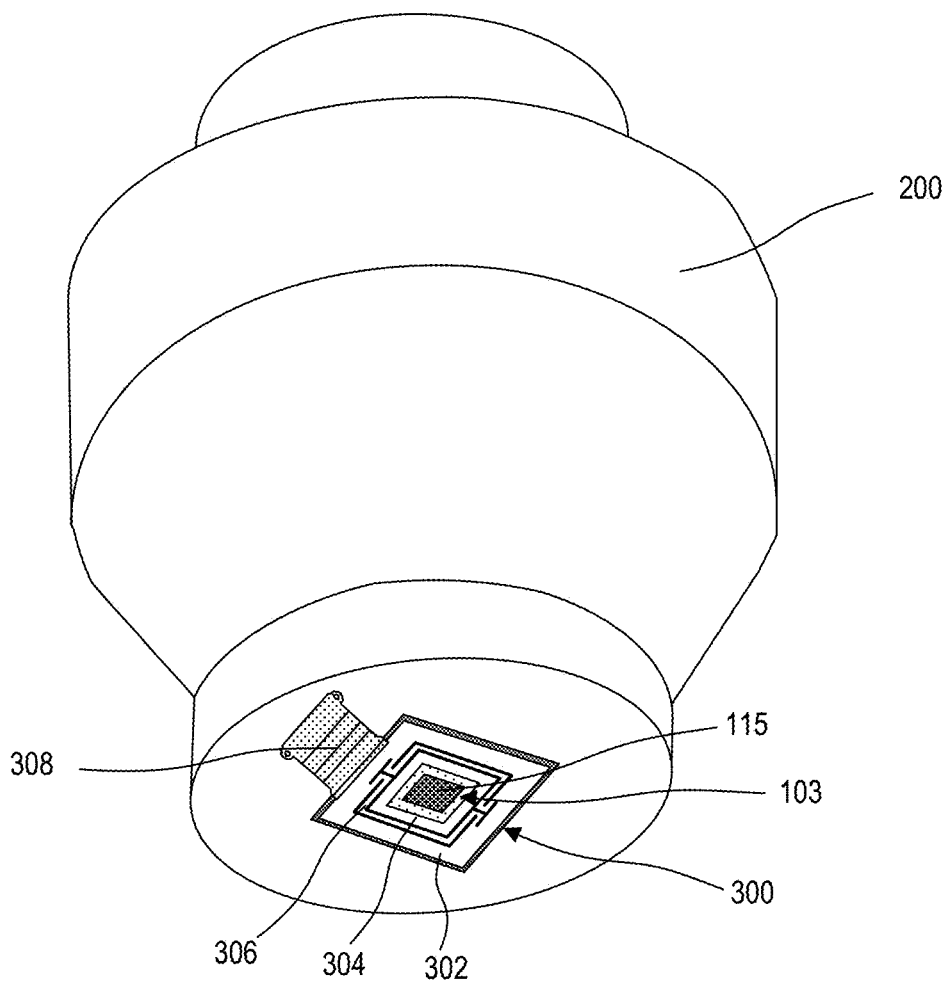
FIG. 2 is a perspective view illustration of a micro pick up array and pivot mount mounted onto a transfer head assembly in accordance with an embodiment.

Referring to FIG. 2, a perspective view of a transfer head assembly 200 is shown in accordance with an embodiment. A transfer head assembly 200 may be used in combination with mass transfer tool 100 to transfer micro devices to or from a substrate, e.g., receiving substrate or carrier substrate, using MPA 103 which is supported by a pivot mount 300. More particularly, transfer head assembly 200 may provide for negligible lateral or vertical parasitic motion for small movements of MPA 103, e.g., motion less than about 5 mrad about a neutral position. Accordingly, transfer head assembly 200 may be incorporated in mass transfer tool 100 to adjust an MPA 103 relative to mass transfer tool 100. Thus, transfer head assembly 200 may be fixed to a chassis of mass transfer tool 100, e.g., at a location along an upper beam or support.

As illustrated, the pivot mount 300 may include a base 302, a pivot platform 304, and plurality of spring arms 306, and the MPA 103 supporting a transfer head array 115 is mounted on the pivot platform 304. In an embodiment, the transfer head array 115 is an electrostatic transfer head array 115, where each transfer head operates in accordance with electrostatic principles to pick up and transfer a corresponding micro device. In an embodiment each electrostatic transfer head has a localized contact point characterized by a maximum dimension of 1-100 μm in both the x- and y-dimensions. In an embodiment, the pivot mount 300 may communicate and send feedback signals to the mass transfer tool 100 through one or more electrical connections, such as a flex circuit 308. As described below, feedback may include analog signals from strain sensing elements that are used in a control loop to regulate actuation and spatial orientation of the transfer head assembly 200. In an embodiment, the feedback signals are sent to a position sensing module located near the pivot mount 300 to reduce signal degradation by limiting a distance that analog signals must travel from a strain sensing element to the position sensing module. In an embodiment, the position sensing module is located within the transfer head assembly 200.

Figure 3:
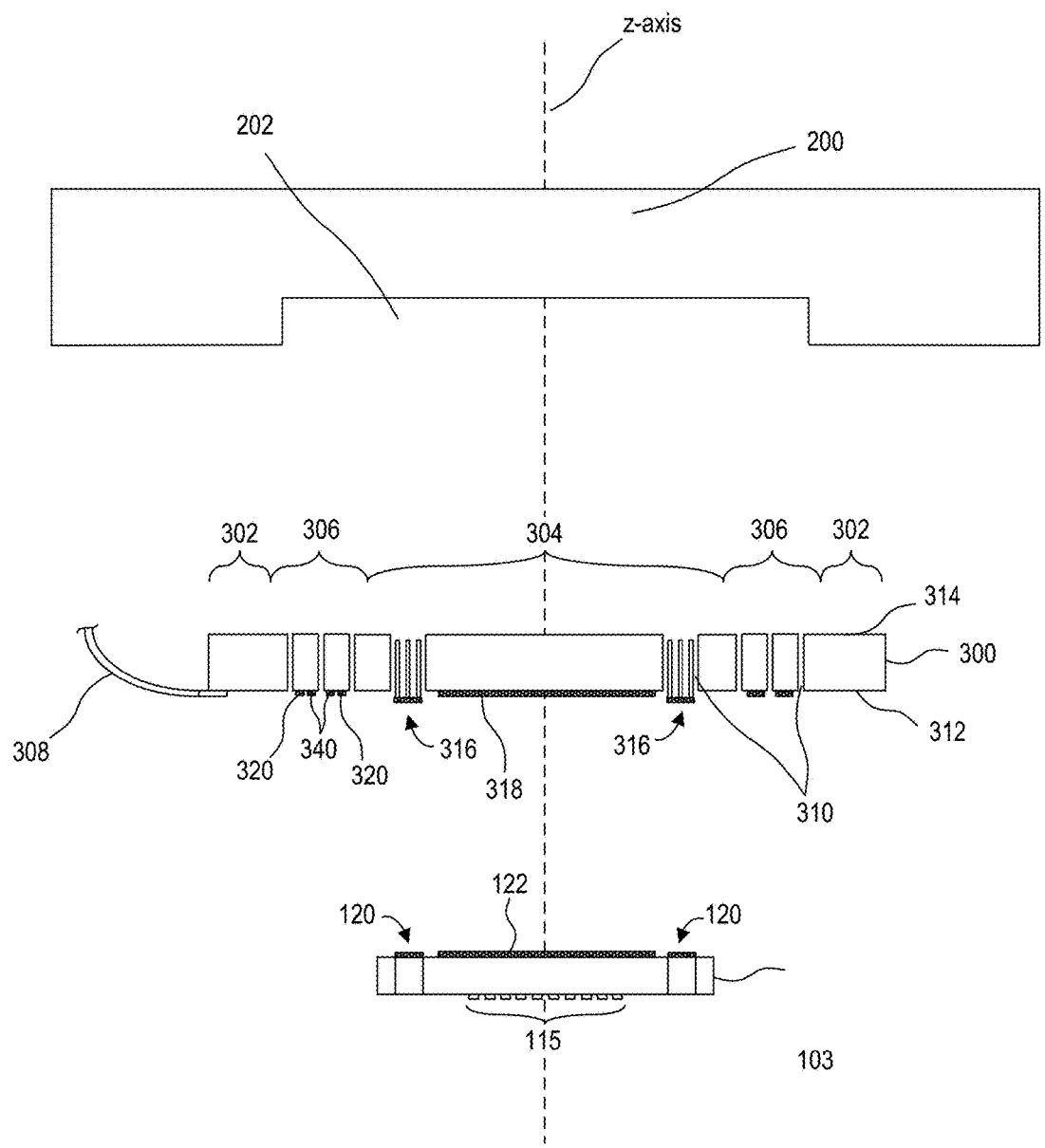
FIG. 3 is an exploded cross-sectional side view illustration of a transfer head assembly, pivot mount, and micro pick up array in accordance with an embodiment.

Referring now to FIG. 3, an exploded cross-sectional side view illustration is provided of a transfer head assembly 200, pivot mount 300, and MPA 103. Generally, the pivot mount 300 is mounted onto the transfer head assembly 200. This may be accomplished using a variety of manners such as using tabs or lips to press the pivot mount against the transfer head assembly 200, bonding, vacuum, or electrostatic clamping. A deflection cavity 202 may be formed in the transfer head assembly 200 to allow a specified z-deflection distance of the pivot platform 200 along the z-axis.

As illustrated in FIG. 3, the pivot mount 300 may include channels 310 formed through a body of the pivot mount from a front surface 312 to back surface 314. Channels 310 may be used for form a variety of compliant features of the pivot mount 300, including defining the spring arms 306 and pivot platform 304, as well as the compliant voltage contacts 316, described in more detail in the following description. The compliant voltage contacts 316 may provide a low contact resistance connection to voltage contacts 120 of the MPA 103. In the embodiment illustrated, the compliant voltage contacts 316 protrude from the pivot platform such that they are raised above the pivot platform. Upon clamping the MPA 103 onto the pivot platform of the pivot mount 300 with the opposing electrostatic clamp contacts 318, 122, the compliant voltage contacts 316 exert a pressure upon the MPA contacts 120. Additional features may be located on or in the pivot mount 300. For example, strain sensing elements 320 (strain gages) and reference gages 340 may be located at high strain regions of the spring arms 306, as described in further detail in the following description.

Figure 4:
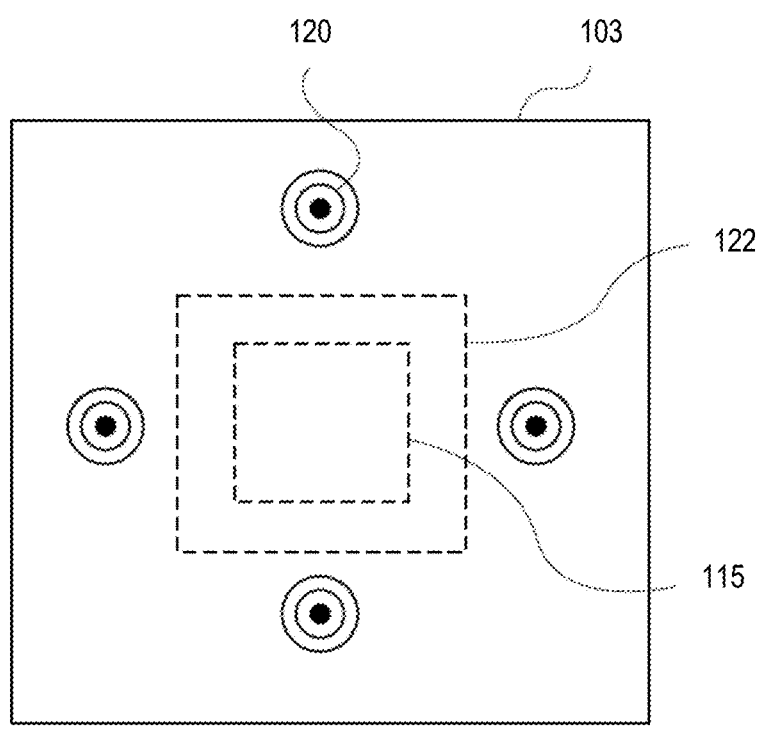
FIG. 4 is a schematic top view illustration of a micro pick up array in accordance with an embodiment.

Referring now to FIG. 4, a schematic top view illustration of a MPA 103 is shown in accordance with an embodiment. In an embodiment, an area of the electrostatic clamp contact 122 on a back side of the MPA is larger than an area of the transfer head array 115 on the front surface of the MPA. In this manner, the alignment and planarity across the transfer heads in the transfer head array 115 can be regulated by alignment of the transfer head assembly. In such an embodiment, a plurality of voltage contacts 120 for supplying an operating voltage to the transfer head array 115 is located outside the periphery of the transfer head array 115.

Figure 5A:
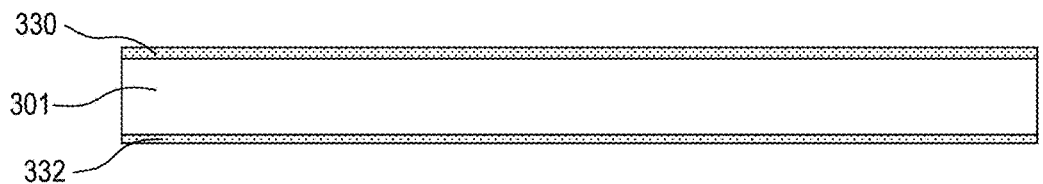
FIGS. 5A-5E are cross-sectional side view illustrations of a method of forming a pivot mount including compliant voltage contacts in accordance with an embodiment.
Figure 5B:
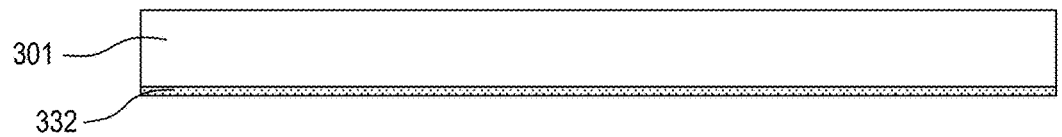
Figure 5C:
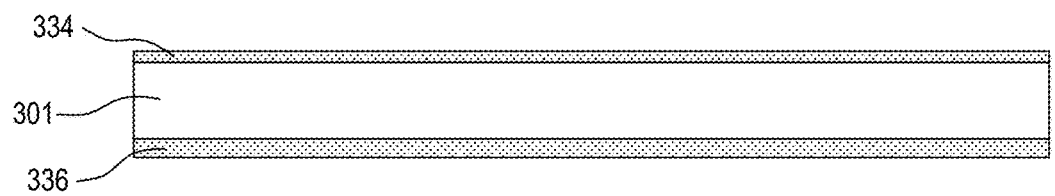
Figure 5D:
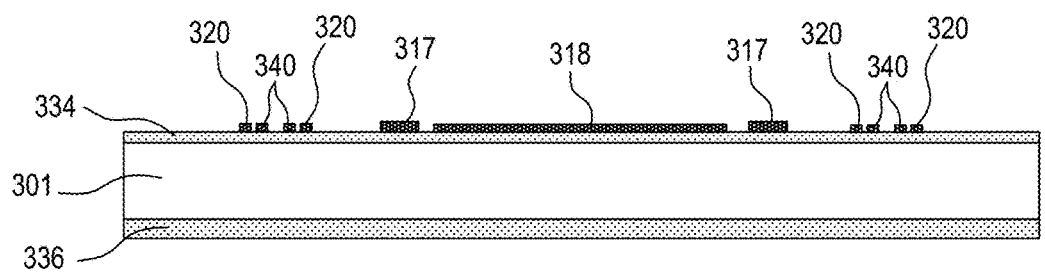
Figure 5E:
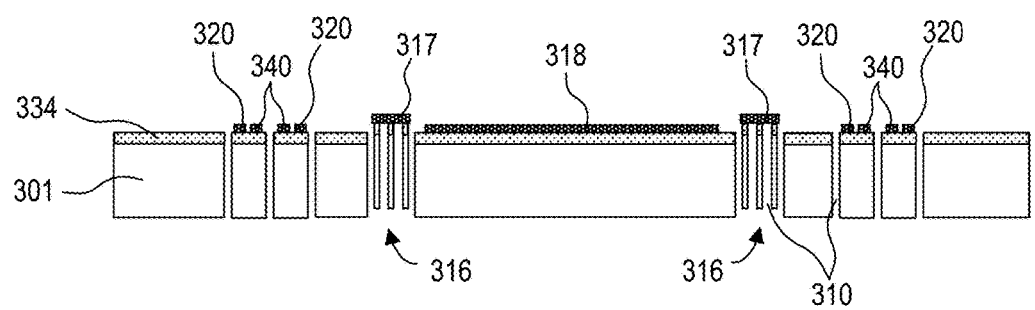

Referring now to FIGS. 5A-5E, cross-sectional side view illustrations are shown for a method of forming a pivot mount 300 including compliant voltage contacts 316. The processing sequence may begin with a commercially available silicon wafer 301 including a top oxide layer 330, and bottom oxide layer 332 as illustrated in FIG. 5A. While the following description is made with regard to a silicon wafer, embodiments are not so limited, and other suitable substrates can be used to form pivot mount 300, such a silicon carbide, aluminum nitride, stainless steel, and aluminum, amongst others. In an embodiment illustrated in FIG. 5B, the top oxide layer 330 is then removed, with bottom oxide layer 330 remaining. Referring to FIG. 5C, the top and bottom surfaces of the wafer 301 may then be oxidized further resulting in a top oxide layer 334, and bottom oxide layer 336 that is thicker than the previous bottom oxide layer 332 and thicker than the top oxide layer 334. For example, this may be accomplished with a wet thermal oxidation operation. Following the formation of oxide layers 334, 336 various layers may be formed over the top oxide layer 334 to form the strain gages 320, reference gages 340, electrostatic clamp contact(s) 318, and electrodes 317 for the compliant voltage contacts. In an embodiment, these various layers may be formed by one or more metal deposition processes. In an embodiment, the electrodes 317 for the compliant voltage contacts are thicker than other metallization layers used to form the strain gages 320, reference gages 340, and electrostatic clamp contact(s) 318. Referring to FIG. 5E, the bottom oxide layer 336 is removed and channels 310 are etched through the silicon wafer 301 and top oxide layer 334 to define the spring arms 306, pivot platform 304, and compliant voltage contacts 316. As shown in FIG. 5E, the contact surfaces including the electrodes 317 for the compliant voltage contacts 316 protrude from the pivot platform such that they are elevated above the surrounding pivot platform, including the strain gages 320, reference gages 340, and electrostatic clamp contact(s) 318. This may be the result of releasing residual stress within the silicon wafer 301 during formation of the channels 310. In an embodiment, the residual stress was created in the silicon wafer 301 during the oxidation and removal operation described and illustrated in FIGS. 5A-5C. In accordance with embodiments of the invention, the channels 310 forming the compliant voltage contacts 316 may assume a variety of configurations such as switch-backs or a winding contour. In an embodiment, the channels forming the compliant voltage contacts 316 are made in a spiral configuration which can achieve a high amount of compliance within a small area.

Referring again to FIG. 4, the voltage contacts 120 of the MPA 103 align with the compliant voltage contacts 316 in the pivot platform 304 of the pivot mount 300. Once the MPA is clamped onto the pivot mount pivot platform, for example, using an electrostatic clamp contact on the pivot mount platform, the compliant voltage contacts 316 exert a pressure upon the MPA voltage contacts 120 to achieve low contact resistance connections.

Figure 6:
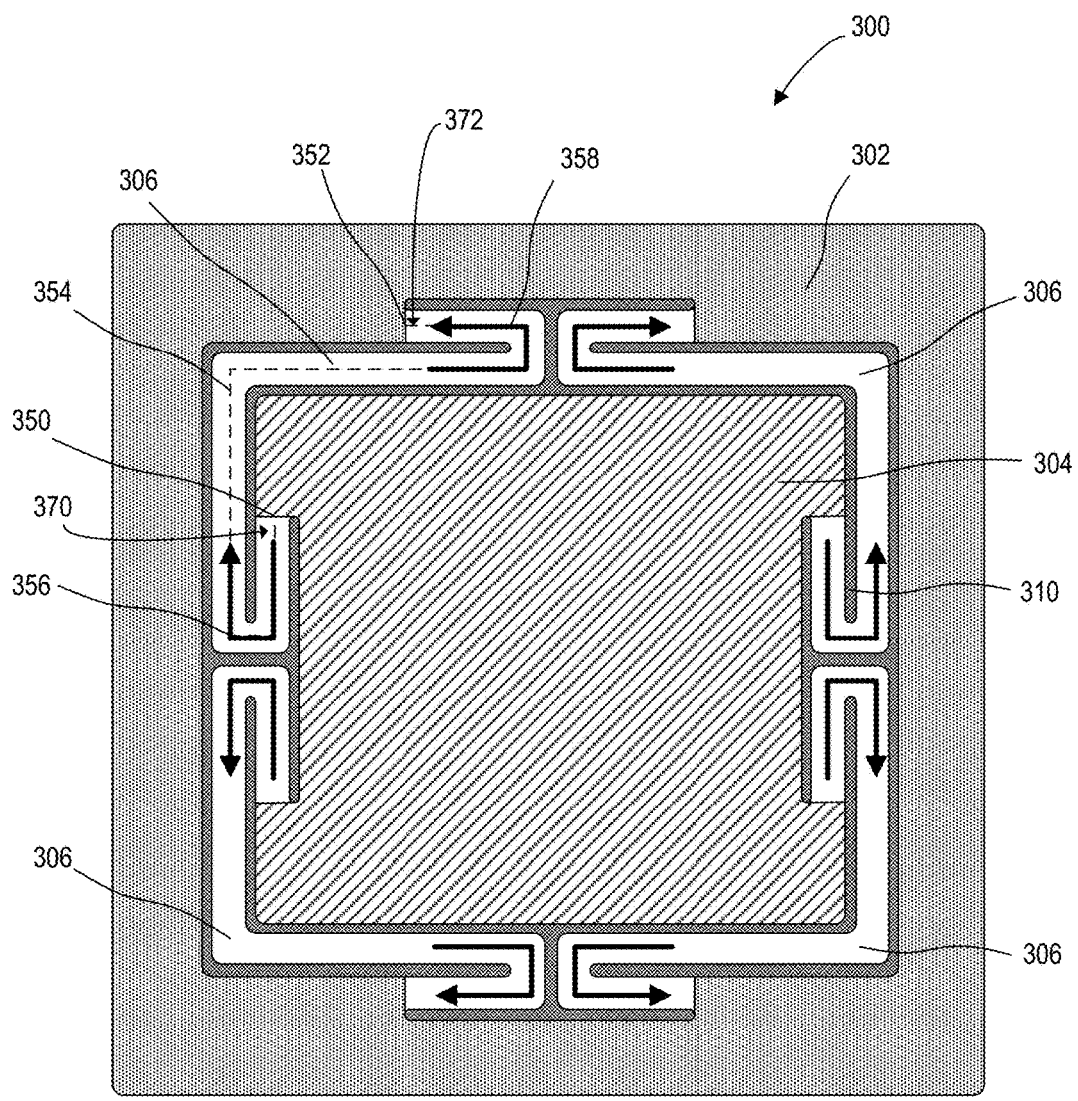
FIGS. 6-7 are top view illustrations of various structural features of a pivot mount in accordance with an embodiment.

FIGS. 6-8B illustrate various structural aspects of a pivot mount 300. Referring to FIG. 6, in an embodiment pivot mount 300 includes a base 302, a pivot platform 304, and a plurality of spring arms 306. Each spring arm 306 is fixed to the pivot platform 304 at a corresponding inner root 350, and fixed to the base at a corresponding outer root 352. Each spring arm 306 includes at least one switch-back along an axial length 354 of the spring arm such that a pair of lengths of the spring arm adjacent the switch-back are parallel to each other. In the embodiment illustrated in FIG. 6, each spring arm 306 includes an inner switch-back 356 along an inner length of the spring arm and an outer switch-back 358 along an outer length of the spring arm. In an embodiment, an inner length 370 of the spring arm extending from the pivot platform 304 (along the axial length 354 of the spring arm 306) is perpendicular to the inner root 350. In an embodiment, an outer length 372 of the spring arm extending from the base 302 (along the axial length 354 of the spring arm 306) is perpendicular to the outer root 352.

Figure 7:
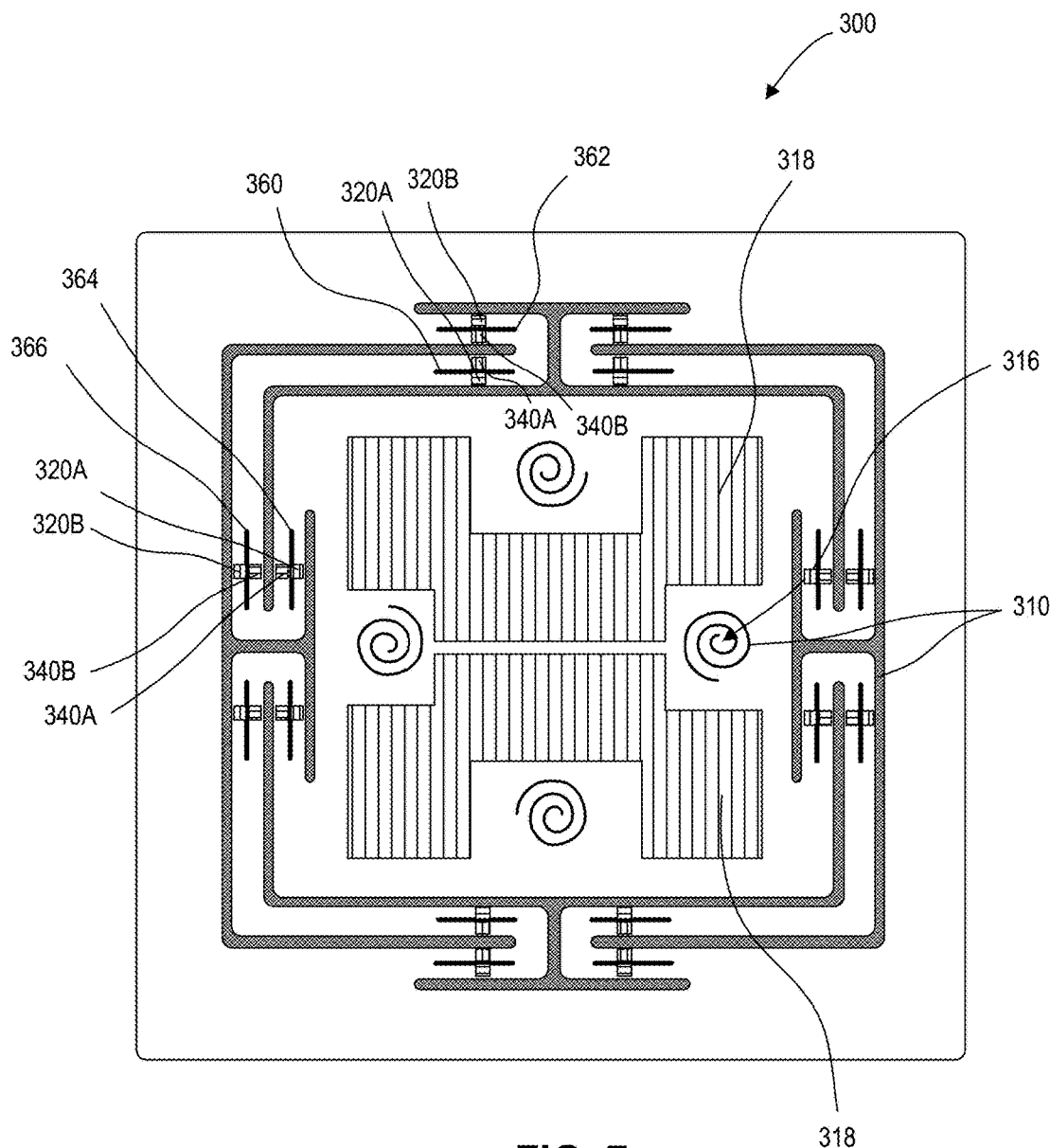

Referring now to FIG. 7, each switch-back along the axial length of the spring arm results in a parallel pair of lengths of the spring arm adjacent the switch-back. For example, a portion of the spring arm immediately adjacent the outer switch-back 358 includes a first length 360 and a second length 362 of the spring arm that are parallel to each other. Similarly, a portion of the spring arm immediately adjacent the inner switch-back 356 includes a first length 364 and a second length 366 of the spring arm that are parallel to each other. A first strain sensing element may be located at the first length of the spring arm adjacent a switch-back, and a second strain sensing element may be located at the second length of the spring arm adjacent the switch-back. Furthermore, first reference gage may be located adjacent the first strain sensing element at the first length, and a second reference gage may be located adjacent the second strain sensing element at the second length. In the particular embodiment illustrated in FIG. 7, a first strain sensing element 320A is located at the first length of 360 the spring arm adjacent the outer switch-back 358, and a second strain sensing element 320B is located at the second length 362 of the spring arm adjacent the outer switch-back 358. Furthermore, first reference gage 340A is located adjacent the first strain sensing element 320A at the first length 360, and a second reference gage 340B is located adjacent the second strain sensing element 320B at the second length 362. In the particular embodiment illustrated in FIG. 7, a first strain sensing element 320A is located at the first length of 364 the spring arm adjacent the inner switch-back 356, and a second strain sensing element 320B is located at the second length 366 of the spring arm adjacent the inner switch-back 356. Furthermore, first reference gage 340A is located adjacent the first strain sensing element 320A at the first length 364, and a second reference gage 340B is located adjacent the second strain sensing element 320B at the second length 366.

Referring now to both FIGS. 6 and 7, in an embodiment the first and second lengths 364, 366 of the spring arm (along the axial length 354 of the spring arm 306) adjacent the inner switch-back 356 are perpendicular to the inner root 350. In an embodiment, the first and second lengths 360, 362 of the spring arm (along the axial length 354 of the spring arm 306) adjacent the outer switch-back 358 are perpendicular to the outer root 352.

Figures 8A, 8B:
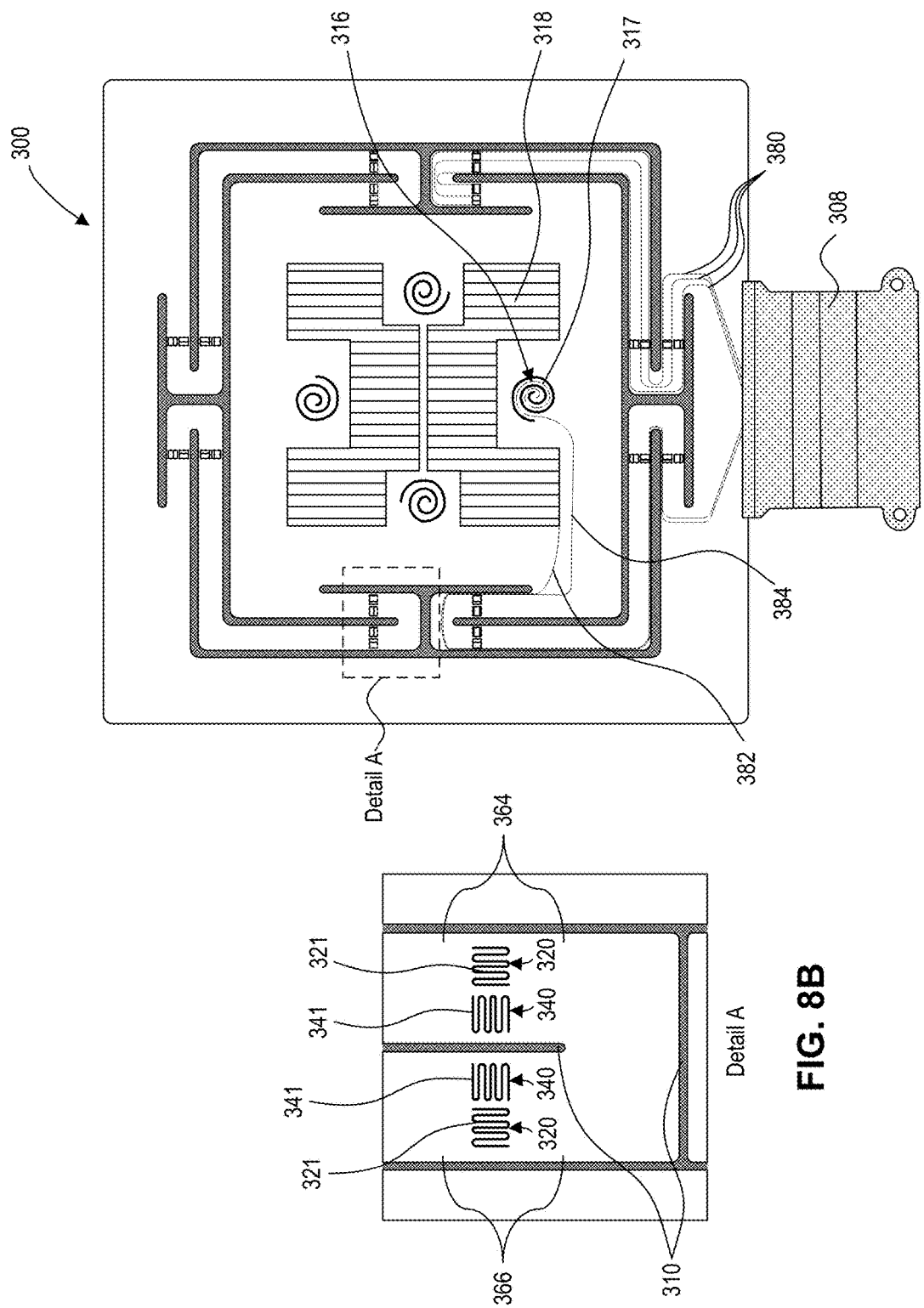
FIG. 8A is a top view illustration of a pivot mount including electrical routing in accordance with an embodiment.
FIG. 8B is a close up view illustration of Detail A in FIG. 8A in accordance with an embodiment.

FIG. 8A is a top view illustration of a pivot mount including electrical routing in accordance with an embodiment. As illustrated, wiring can be routed on the top surface of the pivot mount for operation of various components. In an embodiment wiring 380 is provided for operation of the strain sensing elements 320 and reference gages 340. In an embodiment wiring 382 is provided for operation of the electrostatic clamp contacts 318. In an embodiment wiring 384 is provided for operation of the compliant voltage contacts 316. In the particular embodiment illustrated, the wiring 384 connects with the electrodes 317 for the compliant voltage contacts 316, where the electrodes form a spiral pattern within the spiral channels 310 forming the compliant voltage contacts. Wiring 380, 382, and 384 can run over one or more portions of the pivot mount including the base 302, spring arms 306, and pivot platform 304. Wiring 380, 382, and 384 may be formed using a suitable technique such s sputtering or e-beam evaporation, or may be a wire that is bonded to the pivot mount.

Wiring 380, 382, and 384 may be routed to an electrical connection, such as a flex circuit 308, at an edge of the base 302 of the pivot mount. For example, an operating voltage can be applied trough the flex circuit 308 to operate the electrostatic clamp contacts 318 to clamp the MPA onto the pivot mount 300. Another operating voltage can be applied through the flex circuit 308 to operate the compliant voltage contacts 316 which transfer an operational voltage to the array of electrostatic transfer heads in order to provide a grip pressure to pick up micro devices. Additionally, the flex circuit 308 can transfer the feedback signals from the strain sensing elements 320 and reference gages 340 to a position sensing module or computer 108 to regulate actuation and spatial orientation of the transfer head assembly 200.

Referring now to FIG. 8B, an enlarged view of Detail A from FIG. 8A is illustrated. In the particular embodiment illustrated the strain sensing elements 320 and reference gages 340 along the first and second lengths 364, 366 of the spring arm adjacent the inner switch-back 356 are shown in more detail. In an embodiment, strain sensing elements 320 may be strain gages that measure deformation of spring arm 306. The strain gages may exhibit an electrical resistance that varies with material deformation. More specifically, the strain gages may deform when spring arm 306 deforms. That is, the strain gage design may be selected based on environmental and operating conditions associated with the transfer of micro devices from a carrier substrate, to achieve the necessary accuracy, stability, cyclic endurance, etc. Accordingly, the strain gages may be formed from various materials and integrated with the spring arm in numerous ways to achieve this goal. Several such embodiments are described below.

A strain gage may be separately formed from spring arm 306 and attached thereto. In an embodiment, the strain gage includes an insulative flexible backing that supports a foil formed from polysilicon and electrically insulates the foil from spring arm 306. The foil may be arranged in a serpentine pattern, for example. An example of an attachable strain gage is a Series 015DJ general purpose strain gage manufactured by Vishay Precision Group headquartered in Malvern, Pa. A strain gage that is separately formed from spring arm 306 may be attached to spring arm 306 using numerous processes. For example, the strain gage backing may be directly attached to spring arm 306 with an adhesive or other bonding operation. More specifically, strain gage backing may be fixed to a surface of spring arm 306 using solder, epoxy, or a combination of solder and a high-temperature epoxy.

In another embodiment, a strain gage may be formed on spring arm 306 in a desired pattern, such as a serpentine pattern. In an embodiment, a strain gage may be formed directly on spring arm 306 using a deposition process. For example, constantan copper-nickel traces may be sputtered directly on spring arm 306 in a serpentine pattern. The dimensions of a strand of a sputtered strain gage having a serpentine pattern may be about 8 micron width with about an 8 micron distance between strand lengths and may be deposited to a thickness of about 105 nanometers.

In another embodiment, the material of spring arm 306 may be modified to form an integrated strain gage. More specifically, spring arm 306 may be doped with a piezoresistive material to create a strain gage within spring arm 306. As an example, the surface of spring arm 306 may be doped silicon. The doped material may be in a serpentine pattern, having dimensions that vary with an applied strain. Thus, the strain gage may be fully integrated and physically indistinct from the remainder of spring arm 306.

During the transfer of micro devices from a carrier substrate, spring arm 306 and strain sensing elements 320 may be subjected to elevated temperatures, and thus, temperature compensation may be necessary. In an embodiment, strain sensing element 320 (strain gage) may be self-temperature compensated. More specifically, strain gage material may be chosen to limit temperature-induced apparent strain over the operating conditions of the transfer process. However, in an alternative embodiment, other manners for temperature compensation may be used. For example, temperature compensation may be achieved using a reference gage technique.

In an embodiment, strain sensing element 320 may be a strain gage on spring arm 306 having a pattern (e.g. serpentine) of lengthwise strands that align in a direction of anticipated normal strain at the surface of the spring arm. Still referring to FIG. 8B, in an embodiment, a reference gage technique utilizes a reference gage 340 to compensate for strain sensing element 320. More particularly, reference gage 340 may be located adjacent strain sensing element 320 in the same area of strain. While strands of strain sensing element 320 may align with the direction of applied strain, strands of reference gage 340 may extend perpendicular to the strands of strain sensing element 320 and to the direction of applied strain. Alternatively, reference gage 340 may be located in a non-strain area of the pivot mount 300, apart from strain sensing element 320, which is located in a high strain area of spring arm 306. For example, reference gage 340 may be located on base 302 or pivot platform 304. In each configuration, strain sensing element 320 detects a strain applied to spring arm 306 and reference gage 340 detects strain from thermal effects on the pivot mount 300. Accordingly, a comparison of strain in the strain sensing element 320 and reference gage 340 may be used to determine, and compensate for, strain related to thermal expansion of spring arm 306.

In particular, the strands 341 in the references gages 340 are oriented perpendicular to strands 321 in the strain sensing elements 320. As will become more apparent in the following description, the normal strain at the surface that results at the first and second lengths 364, 366 of the spring arm during operation of the pivot mount is substantially parallel to the strands 321 in the strain sensing elements, and perpendicular to the strands 341 in the reference strain gages. Similar strain relationships are found at all of the inner switch-backs 356 and outer switch-backs 358, wherein normal strain at the surface that occurs during operation of the pivot mount is substantially parallel to the strands in the strain sensing elements 320.

Figure 9A:
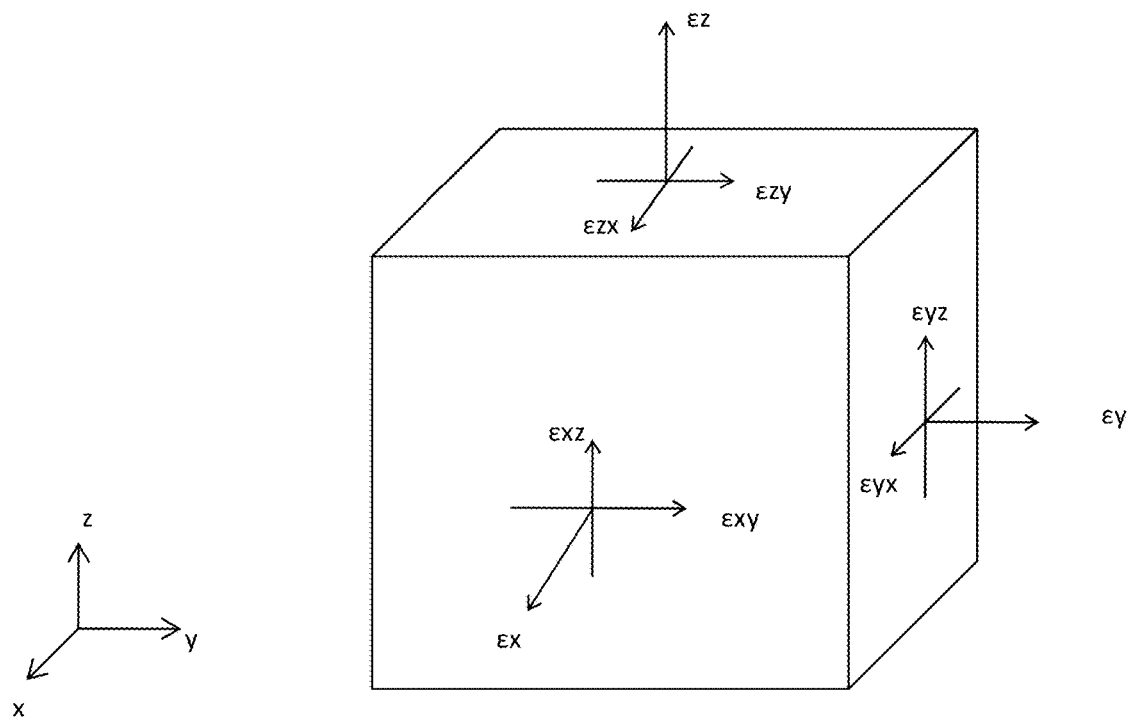
FIG. 9A is an illustration of strain components in a body.
Figure 9B:
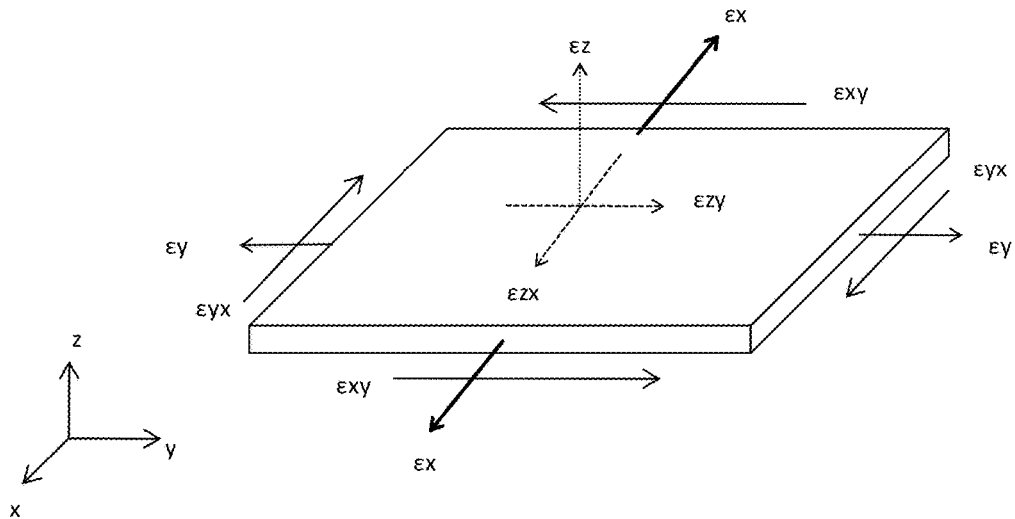
FIG. 9B is an illustration of strain components in a thin structure.

Referring now to FIG. 9A, strain at any point in a body may be described by nine strain components. These include three normal strains ($\epsilon x$, $\epsilon y$, $\epsilon z$) and six shear strain components ($\epsilon xy$, $\epsilon xz$, $\epsilon yx$, $\epsilon yz$, $\epsilon zx$, and $\epsilon zy$). Strain components in a thin structure are illustrated in FIG. 9B. For a thin pivot mount structure shear strains on the surface ($\epsilon zx$ and $\epsilon zy$) and out-of-plane normal strain ($\epsilon z$) are not significant. This idealization is known as plane stress. Accordingly, in an embodiment the strain gages (strain sensing elements and reference gages) on the surface of the pivot mount will measure components of the normal strains $\epsilon x$ and $\epsilon y$. In an embodiment, the pivot mount includes regions of strain loaded only in either pure $\epsilon x$ or pure $\epsilon y$ and directs substantially all available strain into measurable strain.

Figure 10A:
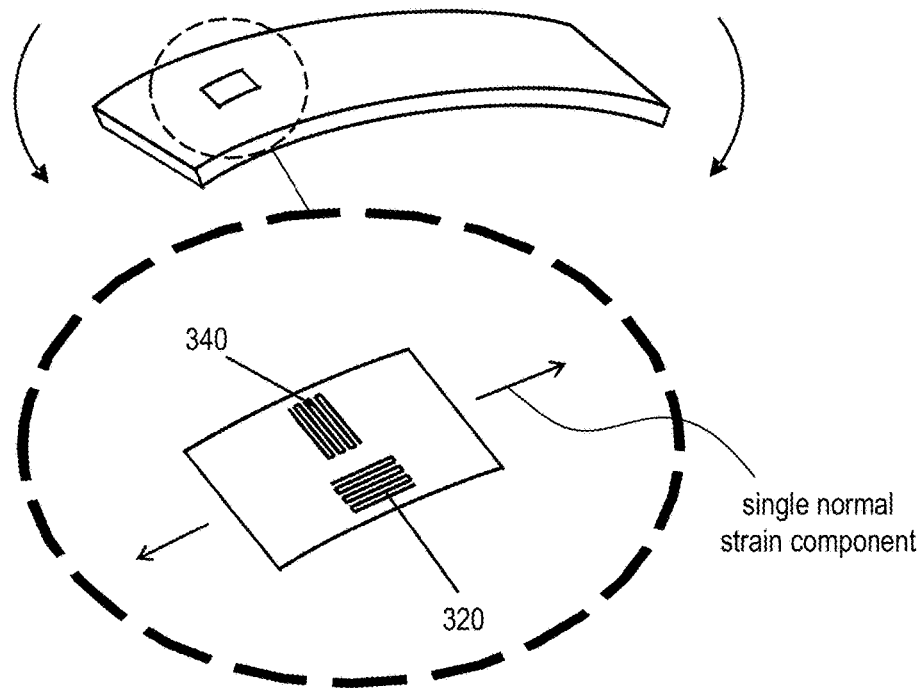
FIG. 10A is an illustration of a spring arm under pure bending in accordance with an embodiment.
Figure 10B:
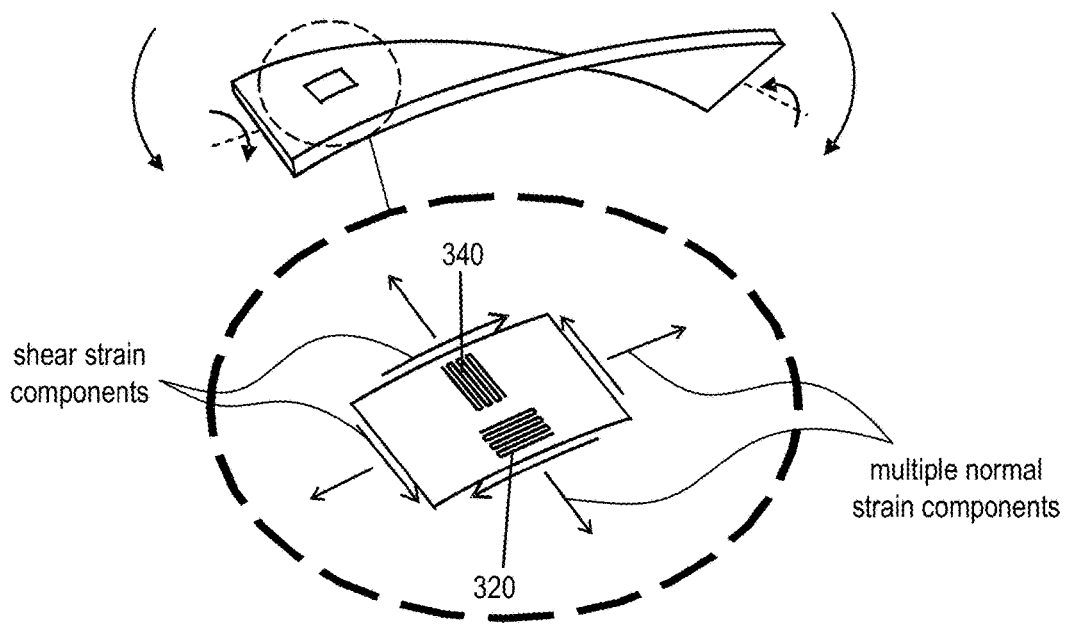
FIG. 10B is an illustration of a spring arm under simultaneous bending and torsion in accordance with an embodiment.

Referring now to FIGS. 10A-10B, the idealization of plane stress is illustrated as realized in accordance with embodiments. FIG. 10A is an illustration of a spring arm under pure bending in accordance with an embodiment. In such an embodiment, the spring arm undergoing pure bending may have a single normal strain component aligned with the spring arm axial length. A reference gage 340 may be oriented perpendicular to the spring arm axial length and not measure any strain due to bending. FIG. 10B is an illustration of a spring arm in both bending and torsion. In such a configuration, normal strain components and shear strain components are produced in multiple directions. In this case both the strain gage 320 and reference gage 340 may measure non-zero strain, which may reduce the ability of the reference gage 340 to compensate for temperature changes.

Figure 11A:
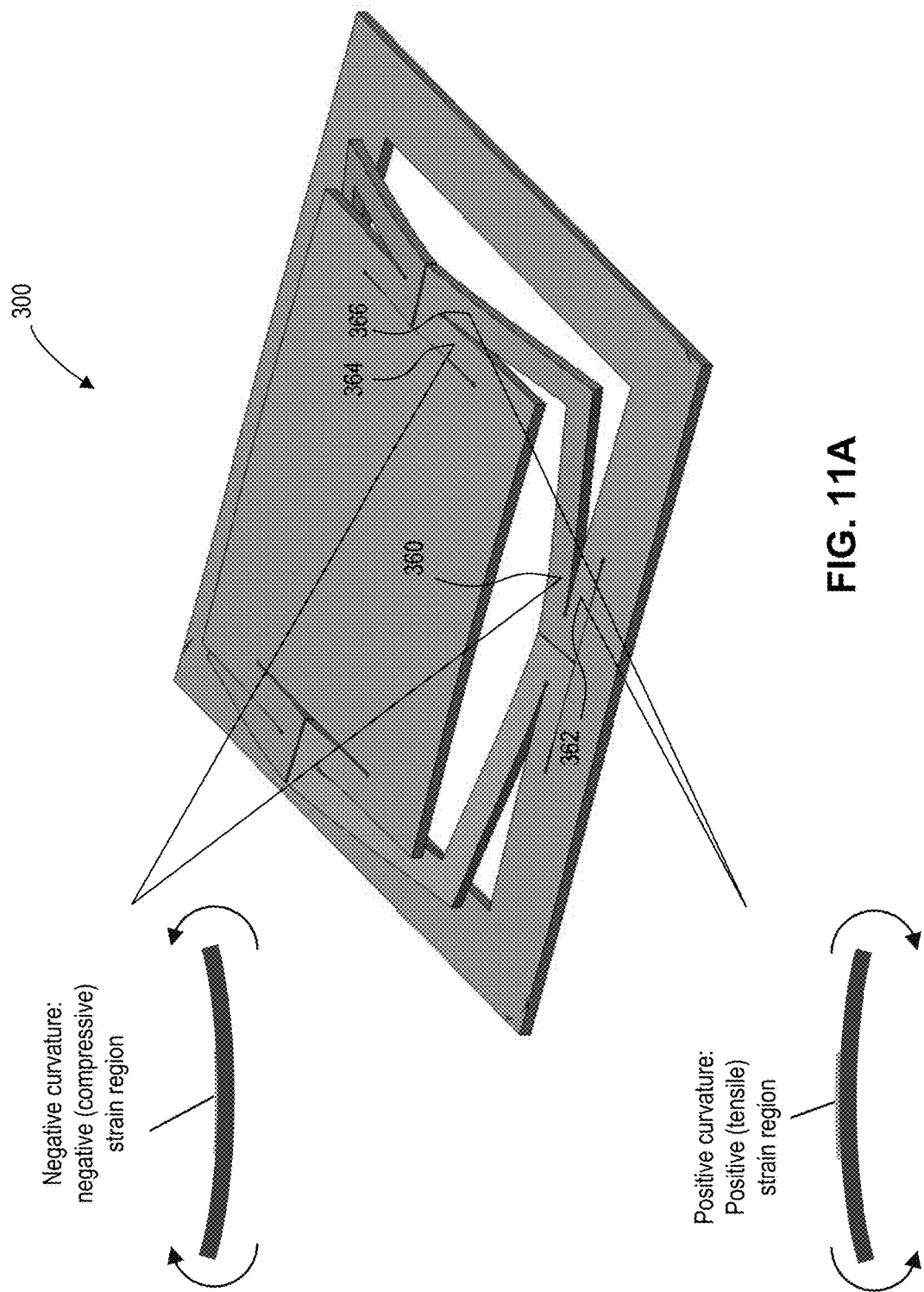
FIG. 11A is a perspective view illustration of a pivot platform of pivot mount 300 deflected with a uniform z displacement in accordance with an embodiment.

In order to illustrate strain confinement within the pivot mount, a pivot mount with a uniform z displacement of the pivot platform 304 is illustrated in FIGS. 11A-11E along with modeling data for strain fields located within the pivot mount. Referring to FIG. 11A, a pivot platform 304 of pivot mount 300 is deflected with a uniform z displacement. Such deflection may be typical during a normal pick and place operation with the mass transfer tool, though the amount of deformation illustrated in FIG. 11A is exaggerated for illustrational purposes. In the particular embodiment illustrated in FIG. 11A, the spring arm 306 along the first length 360 the spring arm adjacent the outer switch-back 358 and the first length 364 of the spring arm adjacent the inner switch-back 356 has a negative curvature and is in a condition of negative (compressive) normal strain at the surface. In the particular embodiment illustrated in FIG. 11A, the spring arm 306 along the second length 362 the spring arm adjacent the outer switch-back 358 and the second length 366 of the spring arm adjacent the inner switch-back 356 has a positive curvature and is in a condition of positive (tensile) normal strain at the surface.

In accordance with embodiments of the invention, a pivot mount structure achieves a high strain sensing sensitivity and generates a feedback signal with a high signal to noise ratio by locating strain sensing elements on opposite sides of switch-backs in an axial length of a spring arm, where equal and opposite strain responses are measured. In this manner, strain signal for a given platform displacement may be effectively doubled, while also reducing noise for a given strain signal since the differential sensing can be used to effectively cancel the noise.

Figure 11B:
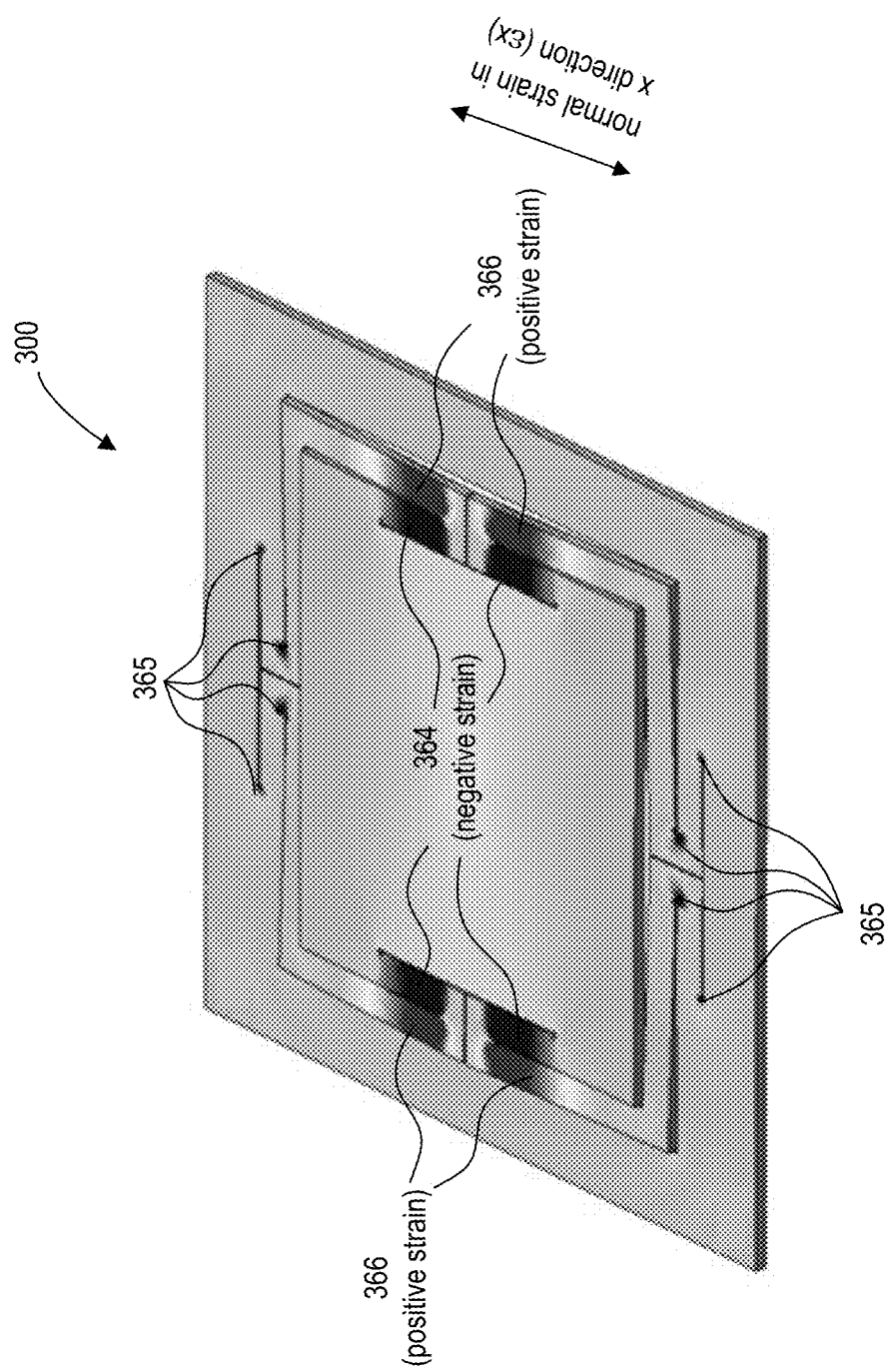
FIG. 11B is a perspective view illustration of strain modeling for normal strain in the x direction for a pivot platform deflected with a uniform z displacement in accordance with an embodiment.

Referring to FIG. 11B, modeling data is provided for the z displacement illustrated in FIG. 11A illustrating normal strain at the outer surface of the pivot mount in the x direction, $\epsilon x$. As illustrated, each spring arm 306 includes an outer switch-back 358 oriented in the y-direction, and an inner switch-back oriented in the x-direction. Of course, simply rotating the pivot mount reverses the orientations of the switch-backs in the x- and y-directions. Importantly, when in the condition of uniform z displacement, the high $\epsilon x$ strain regions are located along the spring arms adjacent the inner switch-backs 356, while minimal or no $\epsilon x$ strain is located along the spring arms adjacent the outer switch-backs 358. Some amount of localized strains are found at various locations within the pivot mount due to local stress concentrations, however these do not affect the strain measurement because the strain gages are located away from the localized strain regions 365. As shown in the FIG. 11B, the spring arm 306 along the first length 364 of the spring arm adjacent the inner switch-back 356 has a negative curvature and is in a condition of negative (compressive) normal strain at the surface, and the second length 366 of the spring arm adjacent the inner switch-back 356 has a positive curvature and is in a condition of positive (tensile) normal strain at the surface. Furthermore, the negative normal strain at first length 364 and positive normal strain at second length 366 are equal and opposite.

Figure 11C:
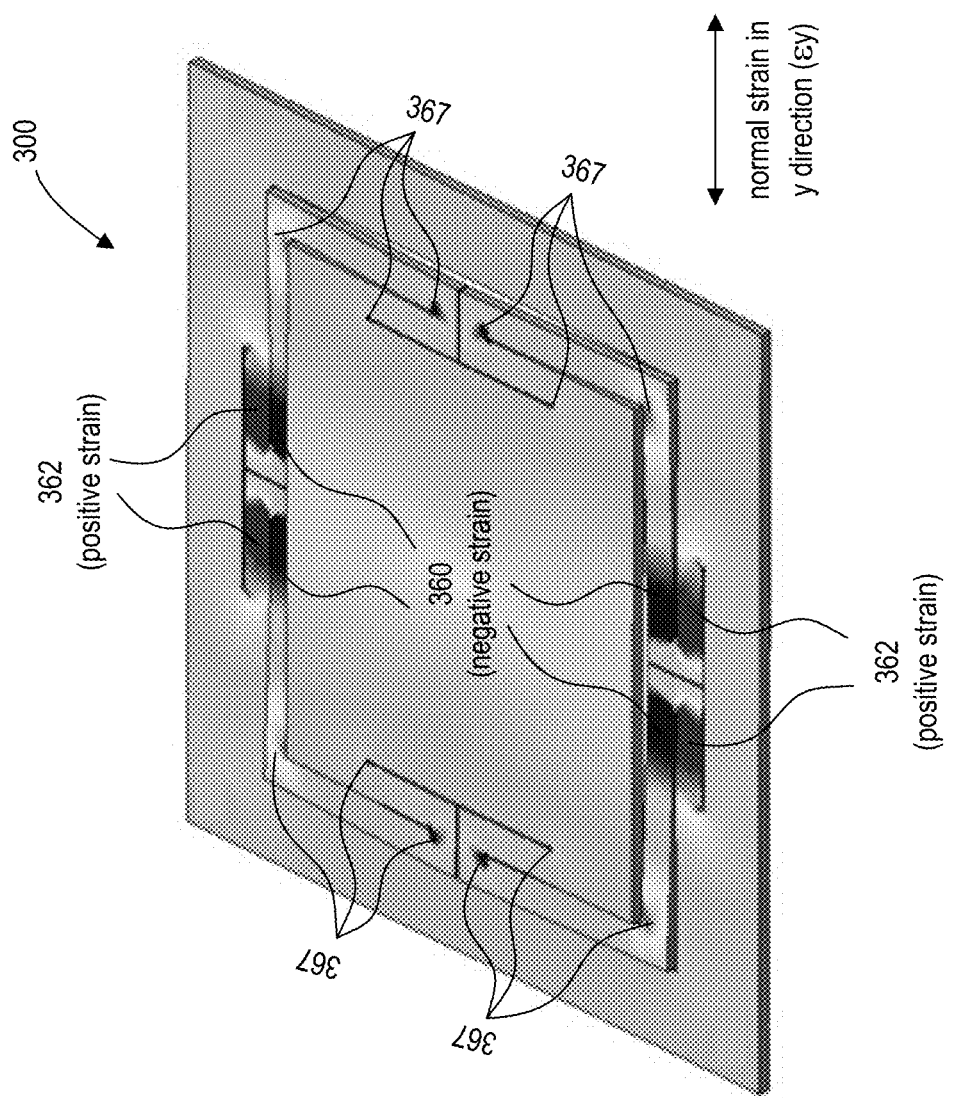
FIG. 11C is a perspective view illustration of strain modeling for normal strain in the y direction for a pivot platform deflected with a uniform z displacement in accordance with an embodiment.

Referring to FIG. 11C, modeling data is provided for the z displacement illustrated in FIG. 11A illustrating normal strain at the outer surface of the pivot mount in the y direction, $\epsilon y$. When in the condition of uniform z displacement, the high $\epsilon y$ strain regions are located along the spring arms adjacent the outer switch-backs 358, while minimal or no $\epsilon y$ strain is located along the spring arms adjacent the inner switch-backs 356. Some amount of localized strains are found at various locations within the pivot mount due to local stress concentrations, however these do not affect the strain measurement because the strain gages are located away from the localized strain regions 367. As shown in the FIG. 11C, the spring arm 306 along the first length 360 of the spring arm adjacent the outer switch-back 358 has a negative curvature and is in a condition of negative (compressive) normal strain, and the second length 362 of the spring arm adjacent the outer switch-back 358 has a positive curvature and is in a condition of positive (tensile) normal strain. Furthermore, the negative normal strain at first length 360 and positive normal strain at second length 362 are equal and opposite.

Figure 11D:
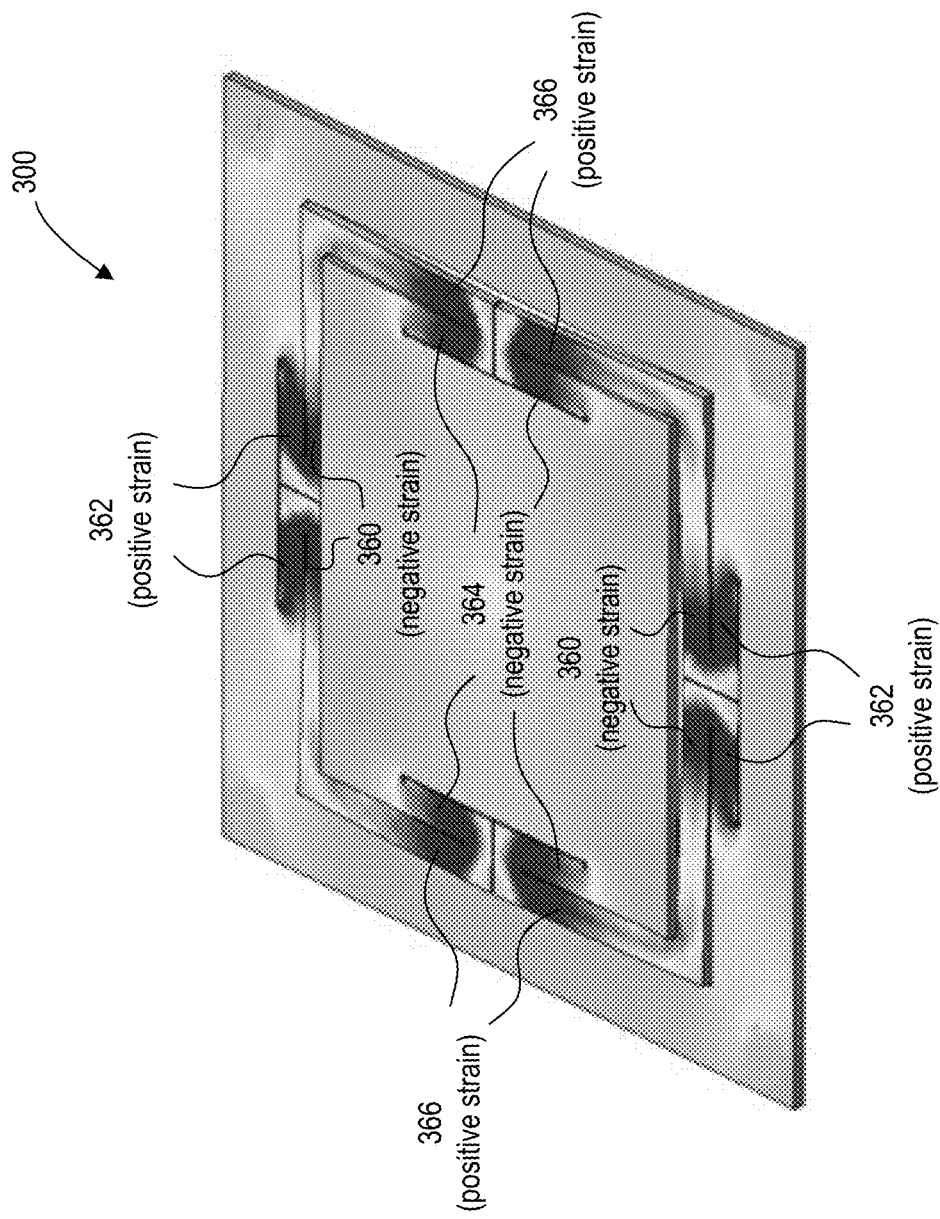
FIG. 11D is a perspective view illustration of strain modeling for equivalent strain magnitude for a pivot platform deflected with a uniform z displacement in accordance with an embodiment.
Figure 11E:
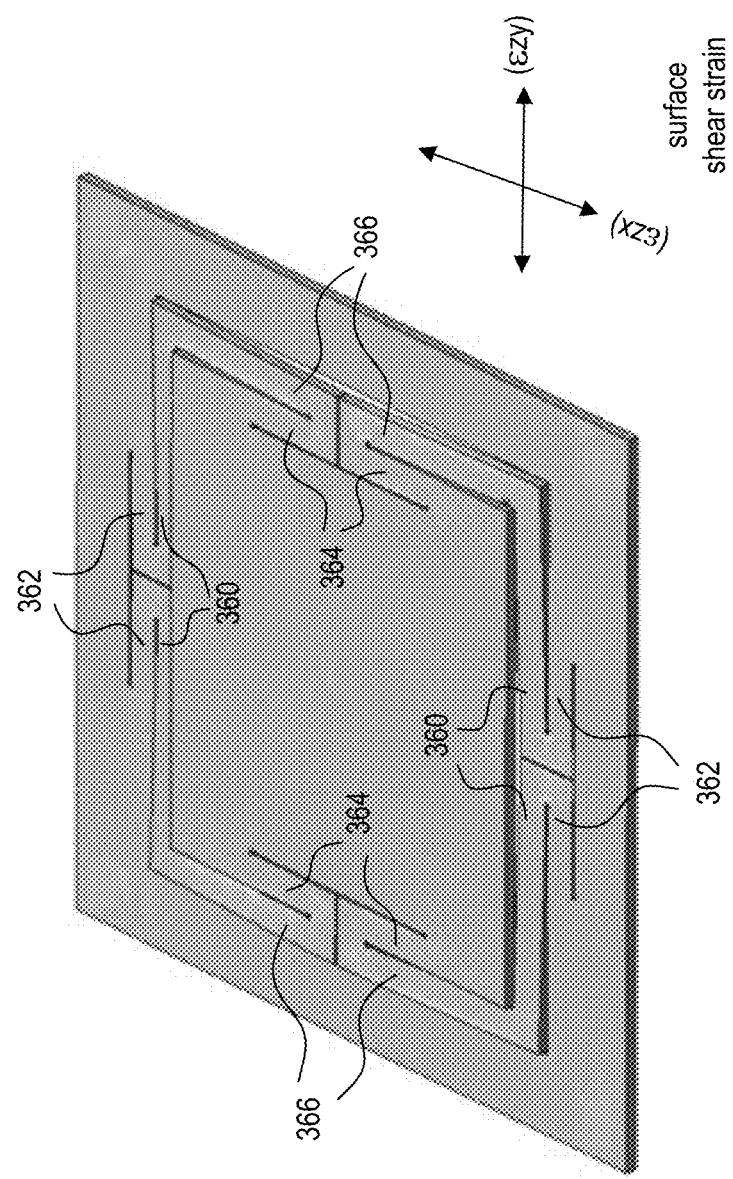
FIG. 11E is a perspective view illustration of strain modeling for surface shear strain for a pivot platform deflected with a uniform z displacement in accordance with an embodiment.

FIG. 11D is an illustration of modeling data for equivalent strain magnitude at the outer surface of the pivot mount in both ϵx and ϵy for the z displacement illustrated in FIG. 11A. As shown, substantially equal strain magnitudes are measured at the first and second lengths for both the inner and outer switchbacks. FIG. 11E is an illustration of modeling data for shear strain at the outer surface of the pivot mount for the z displacement illustrated in FIG. 11A. As illustrated, there is substantially no measurable shear strain at the surface. Thus, the modeling data provided in FIGS. 11A-11E illustrates a pivot mount configuration with substantially uniform bending moments in the high strain regions of the spring arms.

Figure 11F:
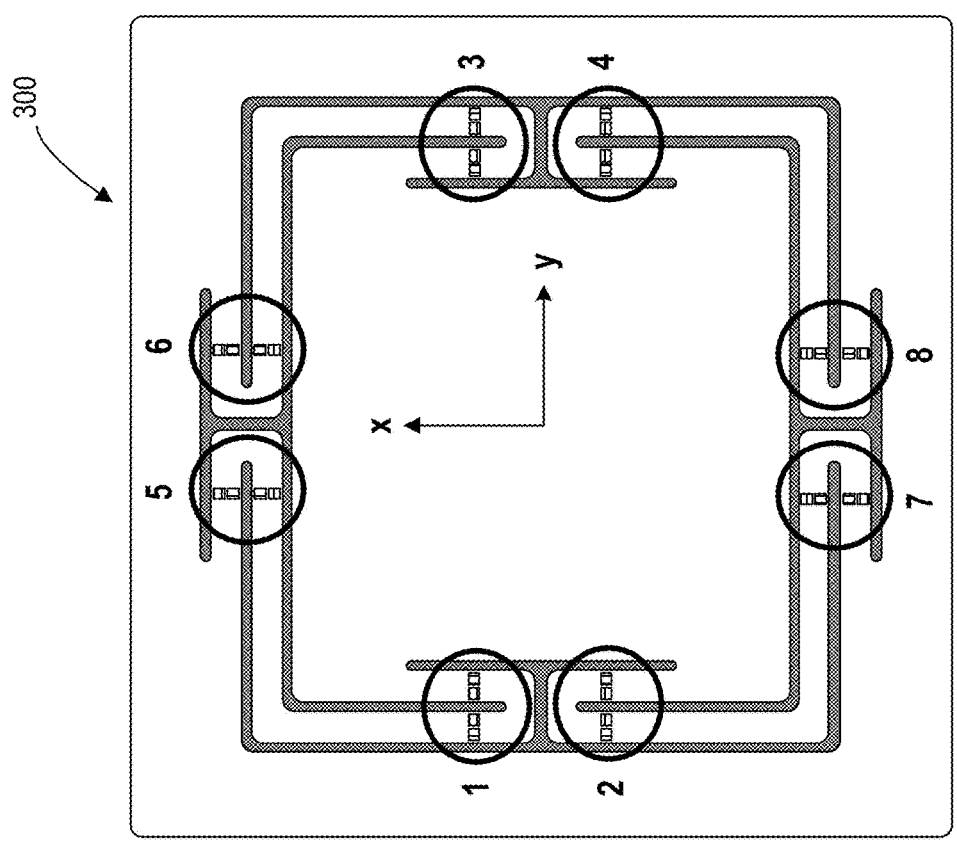
FIG. 11F is a top view illustration of a pivot mount including eight correlated strain sensors in accordance with an embodiment.

Strain sensing elements 320 and reference gages 340 may be arranged into sensors so that the resulting sensor signals are correlated. A set of sensors is considered correlated, or dependent, if the signal of a missing or broken gage in the sensor may be approximated from the remaining set of signals. A minimum set of independent strain signals equal to the number of desired position measurements is required to calculate those measurements. Correlated strain signals in excess of the minimum required set may be included in the position calculation and used to improve the signal to noise ration of the measurement. If a strain gage (320, 340) or sensor failure occurs the calculation may be adjusted to maintain position output albeit with a reduced signal to noise ratio. In this way correlated signals provide redundancy as well as an improved signal to noise ratio. Referring to FIG. 11F, a pivot mount including eight correlated strain sensors is illustrated in accordance with an embodiment of the invention. Specifically, FIG. 11F is an exemplary illustration similar to FIG. 8A described above, including 16 total strain sensing elements 320 (strain gages) and 16 total reference gages 340. In such a configuration, a pair of strain sensing elements (strain gages) and references gauges on opposite sides of a switch-back may correspond to a single strain sensor. As previously described, these pairs of strain sensing elements 320 on opposite sides of a switch-back measure opposite strain types, of equal magnitude. Accordingly, in addition to the following discussion, these strain gages (as well as the corresponding reference gages 340) can also be considered correlated sensors. The strain sensors illustrated in FIG. 11E may be linearly dependent sets (correlated pairs) depending upon whether the pivot platform is rotated about the x-axis, rotated about the y-axis, or is subjected to a vertical displacement. Table I below describes certain correlated pairs of the exemplary embodiment.

TABLE I

Correlated pair strain sensors

Under rotation about the x axis signal 1 = signal 2
signal 3 = signal 4
signal 5 = −signal 6
signal 7 = −signal 8

Under rotation about the y-axis signal 1 = −signal 2
signal 3 = −signal 4
signal 5 = signal 6
signal 7 = signal 8

Under vertical displacement signal 1 = signal 2
signal 3 = signal 4
signal 5 = signal 6
signal 7 = signal 8

In the above exemplary embodiment, several correlated pairs are described for an 8 channel (signal) operation, with each channel corresponding to a signal produced by a pair of strain gages and references gages adjacent a switch-back. Under normal operation, the feedback signal produced by the exemplary pivot mount operating under normal operation can be converted into a synthesized output signal by transformation matrix equation (1):

$$\begin{bmatrix} \theta_x \\ \theta_y \\ Z \end{bmatrix} = \begin{bmatrix} 1 & 1 & -1 & -1 & 1 & -1 & 1 & -1 \\ 1 & -1 & 1 & -1 & 1 & 1 & -1 & -1 \\ 1 & 1 & 1 & 1 & 1 & 1 & 1 & 1 \end{bmatrix} \begin{bmatrix} S_1 \\ S_2 \\ S_3 \\ S_4 \\ S_5 \\ S_6 \\ S_7 \\ S_8 \end{bmatrix} \quad (1)$$

While embodiments of pivot mounts have been described thus far in a square configuration, with switch-backs located along the x-direction or y-direction, embodiments are not so limited. Indeed, the strain sensing elements and reference gages can be located along a number of directions. A generalized transformation matrix for converting a pivot mount feedback signal to a synthesized output signal is represented in equation (2) for n strain signal inputs to 3 position measurement outputs (e.g. tilt, tip, z):

$$\begin{bmatrix} Out_1 \\ Out_2 \\ Out_3 \end{bmatrix} = \begin{bmatrix} A_1 & A_2 & A_3 & \ldots & A_n \\ B_1 & B_2 & B_3 & \ldots & B_n \\ C_1 & B_2 & C_3 & \ldots & C_n \end{bmatrix} \begin{bmatrix} S_1 \\ S_2 \\ S_3 \\ \ldots \\ S_n \end{bmatrix} \quad (2)$$

Figure 12:
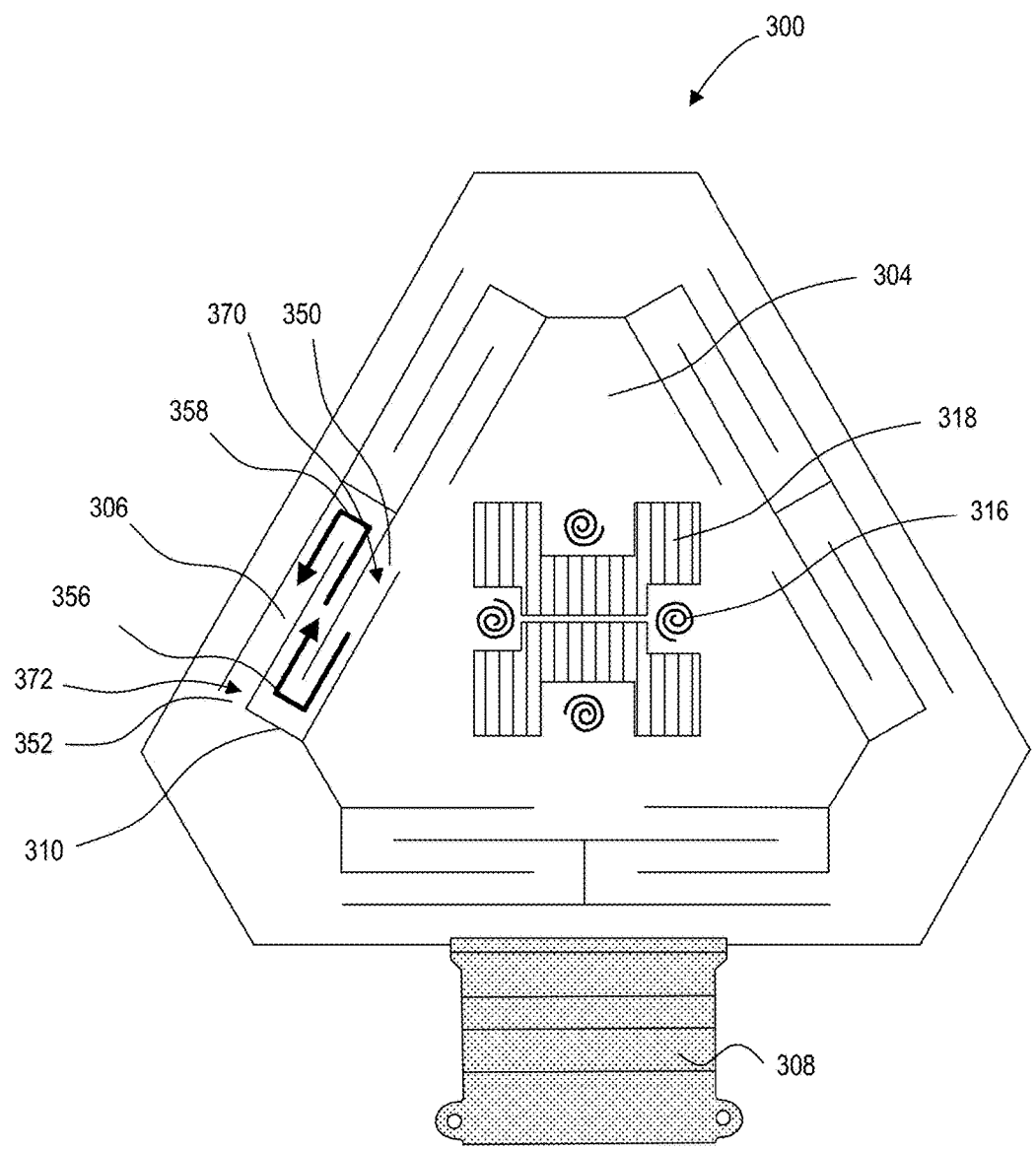
FIG. 12 is top view illustration of a pivot mount in accordance with an embodiment.

In an embodiment illustrated in FIG. 12, a pivot mount 300 includes a base 302, pivot platform 304, and spring arms 306. Each spring arm 306 is fixed to the pivot platform 304 at a corresponding inner root 350, and fixed to the base at a corresponding outer root 352. Each spring arm 306 includes at least one switch-back along an axial length 354 of the spring arm such that a pair of lengths of the spring arm adjacent the switch-back are parallel to each other. In the embodiment illustrated in FIG. 12, each spring arm 306 includes an inner switch-back 356 along an inner length of the spring arm and an outer switch-back 358 along an outer length of the spring arm. In an embodiment, an inner length 370 of the spring arm extending from the pivot platform 304 (along the axial length 354 of the spring arm 306) is perpendicular to the inner root 350. In an embodiment, an outer length 372 of the spring arm extending from the base 302 (along the axial length 354 of the spring arm 306) is perpendicular to the outer root 352. The pivot mount illustrated in FIG. 12 differs from other embodiments of pivot mounts described herein in that the spring arms 306 are arranged in a generally equilateral triangular configuration, rather than a generally square configuration. As a result, strain measured is not located within the only the ϵx and ϵy directions. Nevertheless, the same results of equal and opposite strain, uniform bending moments in the high strain regions, and distributed, correlated pairs is achieved. Accordingly, while embodiments of the invention have been described specific to creating and measuring strain in the ϵx and ϵy directions, embodiments are not so limited, and pivot mount feedback signals may be converted into a synthesized output signal for a variety of geometries.

In accordance with embodiments of the invention, the transfer head assembly 200 may adjust the orientation of the MPA 103 until a desired amount of and/or a desired distribution of pressure across pivot mount 300 is sensed by the pivot mount 300 strain sensing elements 320. Thus, the transfer head array 115 on MPA 103 may be actively aligned with an array of micro devices on a mating substrate. For example, the spatial orientation representing alignment may be predetermined to include a plane passing through the transfer head array 115 being parallel to a plane passing through the array of micro devices. Alternatively, the spatial orientation representing alignment may include the planes not being parallel, but rather, being in some predetermined mutual orientation, such as angled such that only a portion of the transfer head array 115 make contact with respective micro devices when the arrays are brought together. More particularly, the spatial orientation representing alignment of the transfer head array 115 with the array of micro devices may be any predetermined spatial orientation. Such spatial orientation may be monitored, sensed, and measured to determine system characteristics such as distribution of pressure across pivot mount 300. Thus, the measured system characteristics may be used as a proxy to represent alignment. Active alignment may increase the transfer rate of micro devices, since fine-alignment may be accomplished while picking up, and similarly while releasing, the micro devices. Furthermore, active alignment may be made on-the-fly without parasitic translation of the transfer head array 115 that may otherwise smear and damage the array of micro devices. Such on-the-fly adjustments may be useful when a donor substrate, e.g., carrier substrate, and/or a display substrate, e.g., receiving substrate, include surface irregularities and non-planar contours.

Figure 13A:
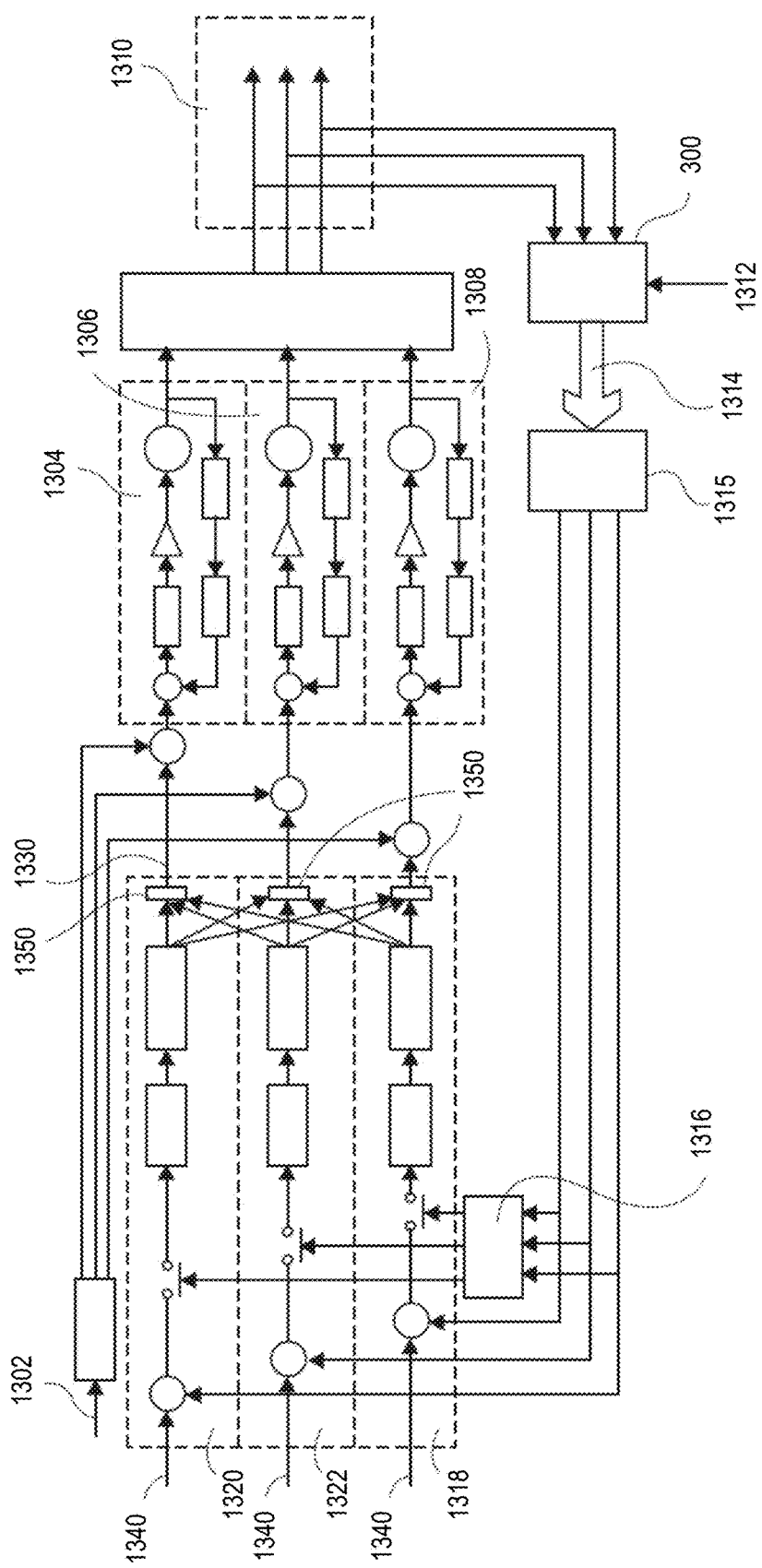
FIG. 13A is a schematic illustration of a control scheme for regulating a transfer head assembly in accordance with an embodiment.

Referring to FIG. 13A, a schematic illustration of a control scheme for regulating a transfer head assembly is shown in accordance with an embodiment. More particularly, the control loop may include multiple sub-loops that process a combination of position and strain inputs. The actuators of transfer head assembly may be driven by the sub-loops, first toward an initial desired location, and if contact between MPA 103 and a target substrate is sensed, then the initial desired location may be modified to move MPA 103 toward a desired stress state, e.g., to evenly distribute pressure across MPA 103 and/or to achieve a desired level of pressure at one or more locations on pivot mount 300 based on a deflection of the pivot mount 300 spring arms 306.

A primary input 1302 may define a set of reference signals that correspond to an initial desired state of MPA 103. More specifically, primary input 1802 may define a target spatial location of MPA 103 relative to an anticipated location of a micro device array or substrate surface. Primary input 1302 may be fed into one of several inner loops, each of which may correspond to an individual actuator. For example, x-actuator inner loop 1304 may correspond to a control loop for controlling an x-actuator of the transfer head assembly, and thus MPA 103, to tip about a remote rotational center. Similarly, y-actuator inner loop 1306 may correspond to a control loop for controlling a y-actuator of the transfer head assembly, and thus MPA 103, to tilt about the remote rotational center. Also, z-actuator inner loop 1308 may correspond to a control loop for controlling a z-actuator of the transfer head assembly and thus a location of MPA 103 along a z-axis. Therefore, the combination of inner loops allow for the control of actuators that adjust a tip, tilt, and z-spatial orientation of MPA 103.

In an embodiment, inner loop control of transfer head assembly 200 actuators results in a primary output 1310. More specifically, primary output 1310 may be an instantaneous geometric configuration of transfer head assembly 200 resulting from actuator movement. The geometric configuration may be inferred from data supplied by encoders or other sensors that track spatial position of individual transfer head assembly 200 components. That is, the geometric configuration may include a combination of individual geometric configurations such as a tip position, tilt position, and z-position. Primary output 1310 may also relate to a spatial position of MPA 103 as inferred from known physical dimensions of transfer head assembly 200 components. Alternatively, MPA 103 surface location may be sensed directly using, e.g., laser micrometers, accelerometers, etc., to provide spatial orientation feedback that may be included directly in primary output 1310. Thus, a position of MPA 103 may be inferred or sensed to determine whether primary output 1310 has been achieved, i.e., equals the intended primary input 1302. However, although MPA 103 may be driven toward a target substrate to achieve the positional command of primary input 1302, in some cases, MPA 103 may contact the target substrate. Furthermore, once contact is detected, primary input 1302 may be modified by additional commands from several actuator outer loops, to achieve a neutral tip and tilt deformation of pivot mount 300 with a desired pressure distribution across pivot mount 300. Accordingly, MPA array 103 may be driven to a tip deflection, tilt deflection, and z-compression target within an accuracy in the submicron range, e.g., on the order of less than about 250 nm.

After contact between a transfer head array 115 of MPA 103 and a micro device has been made, MPA 103 may be finely adjusted based on pressure feedback from the pivot mount 300. More particularly, fine adjustment of MPA 103 may be enabled in response to system recognition of a contact disturbance 1312. In an embodiment, enable logic is included to determine whether a contact disturbance 1312 is sensed prior to MPA 103 achieving the desired primary input 1302, and if a contact disturbance 1312 is sensed, additional control loops may be closed to permit fine adjustment of the transfer head assembly 200. More specifically, additional control loops may be closed to drive MPA 103 toward tip deflection, tilt deflection, and z-compression targets, rather than toward the initial positional target of primary input 1302.

In an embodiment, a contact disturbance 1312 is sensed when, e.g., MPA 103 contacts a mating substrate out of alignment. For example, if MPA 103 and the mating substrate make contact in perfect alignment, the primary output 1810 may equal the primary input 1802 and micro devices may then be gripped by transfer head array 115 without requiring additional adjustment. However, if MPA 103 and the mating substrate are not perfectly aligned, displacement or strain measurements from each strain sensing element 320 on pivot mount 300 may be substantially different from each other and/or the desired level of pressure may not be achieved. That is, in an embodiment, an expected or desired tip, tilt, and compression state must be satisfied prior to initiating electrostatic gripping. If the desired state is not achieved, displacement or strain measurements may be fed as feedback signals 1314.

In an embodiment, feedback signals 1314 correspond to analog signals from the strain sensing elements 320 and references gages 340. In the exemplary embodiment above, feedback signals 1314 may include eight sensor signals from sixteen separate strain sensing elements 320 and sixteen reference gages 340. The feedback signals 1314 may be conditioned by a signal conditioning and combination logic 1315 to transform the analog signals into a synthesized output signal representing a strain state of a respective strain sensing element. These synthesized output signals may furthermore be combined by signal conditioning and combination logic 1315 to synthesize one or more of a pivot mount 300 compression synthesized output signal, a pivot mount 300 tilt deflection synthesized output signal, and a pivot mount 300 tip deflection synthesized output signal represented by a transformation matrix equation, such as equation (1) or equation (2) described above. The synthesized output signals may be provided as inputs to dynamic control enable logic 1316. More particularly, dynamic control enable logic 1316 may observe the one or more synthesized output signals to determine that a contact disturbance 1312 has occurred in one or more of a tip, tilt, or z-direction. For example, if a non-zero compression signal is synthesized by signal conditioning and combination logic 1315 that exceeds predetermined limits, dynamic control enable logic 1316 may recognize the contact disturbance 1312.

In response to observing that a contact disturbance 1312 exists, dynamic control enable logic 1316 may close respective outer loops, each of which may be configured to provide output commands to modify the positional command of primary input 1302. Thus, closing the outer loops may drive the actuators to achieve a desired state of pressure and orientation, rather than driving them to achieve an initial position command. For example, if dynamic control enable logic 1316 observes that a compression contact disturbance 1312 exists, z-actuator outer loop 1318 may be closed to respond to the contact disturbance 1312 by adjusting a z-actuator. Likewise, dynamic control enable logic 1316 may respond to tip deflection signals or tilt deflection signals by enabling x-actuator outer loop 1320 or y-actuator outer loop 1322, respectively.

Deflection and compression feedback signals may be passed from signal conditioning and combination logic 1315 as synthesized output signals to respective outer loops for comparison with deflection command inputs 1340 provided to respective outer loops. In an embodiment, pivot mount 300 deflection command inputs 1340 may correspond to a desired pressure distribution across pivot mount 300 or MPA 103. Thus, pivot mount 300 deflection command inputs 1340 may represent tip deflection, tilt deflection, and z-compression targets of pivot mount 300. These targets may be compared to the synthesized output signals from signal conditioning and combination logic 1315, which indicate an instantaneous pressure distribution across pivot mount 300, to determine a difference. The difference, if any, may then be fed as an error signal to drive respective transfer head assembly 200 actuators. For example, if tipping of pivot mount 300 is sensed as a contact disturbance 1312 and dynamic control enable logic 1316 observes that the tipping exceeds an allowable amount, x-actuator outer loop 1320 may be closed and the tipping deflection signal may be compared with a pivot mount 300 tip deflection command 1340 to generate a motion control signal that will tip pivot mount 300 toward a desired stress state. The motion control signal may be fed to a servo filter and passed through inverse kinematics calculations to generate an outer loop command output 1330. In an embodiment, the motion control signal may also be added with other transfer head assembly motion control signals at one or more of motion summation nodes 1350. This may be the case, for example, when movement of multiple actuators is required to cause tipping.

In order to close the control loop, the outer loop command outputs 1330 may be combined with primary input 1302 and passed back into actuator inner loops. For example, a tipping outer loop command 1330 may be summed with primary input 1302 for an x-actuator and passed through x-actuator inner loop 1304, thereby controlling an x-actuator in such a manner that pivot mount 300 tips toward a physical state of more even pressure distribution. Respective outer loop commands may be passed through to any actuator inner loop for which a contact disturbance 1312 was sensed.

The above control methodology may be performed and repeated until the transfer head assembly 200 is moved to a location at which pressure distribution across pivot mount 300, and hence MPA 103, is uniform and achieves a desired amount of pressure. Thus, transfer head assembly 200 may be controlled to bring an array of electrostatic transfer head array 115 on MPA 103 into contact with an array of micro devices on a mating substrate. Using the control system described above, if alignment between MPA 103 and the mating substrate is not initially perfect, which would be true of almost every transfer operation, pressure distribution control may be implemented to fine tune the alignment. The control methodology may be performed quickly, e.g., on the order of about 50 ms to sense a contact disturbance 1312, enable the appropriate outer loop(s), and feed appropriate outer loop control commands to actuators, and thus, complete contact may be rapidly achieved between an electrostatic transfer head array 115 and an array of micro devices, enabling efficient transfer between a carrier substrate and a receiving substrate.

Figure 13B:
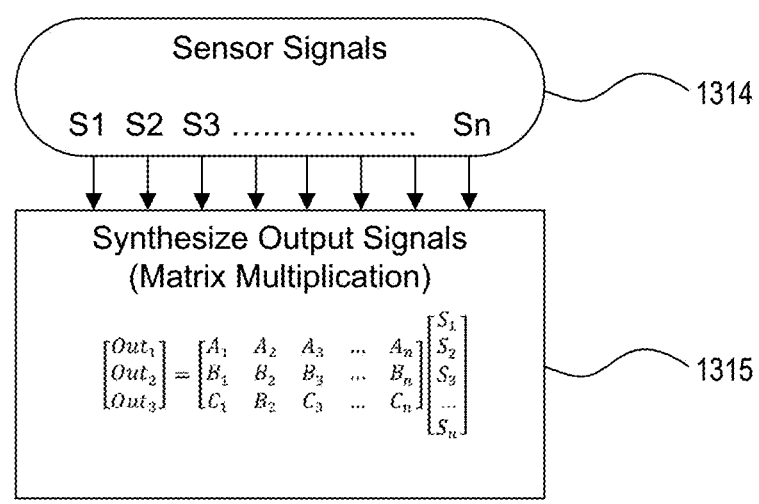
FIG. 13B is a schematic illustration of a method of generating a synthesized output signal in accordance with an embodiment.

Referring now to FIG. 13B, a schematic illustration is provided for a method of generating a synthesized output signal in an embodiment. As illustrated, feedback signals 1314 are received by a signal conditioning and combination logic 1315, which combines the incoming feedback signals 1314 from the pivot mount 300 and generates synthesized output signals. In the simplest case, feedback signals received from the pivot mount (e.g. from sensors 1-8 described above with regard to FIG. 11F) are linearly combined by multiplication with a transformation matrix to form a set of output measurements (synthesized output signals).

Figure 13C:
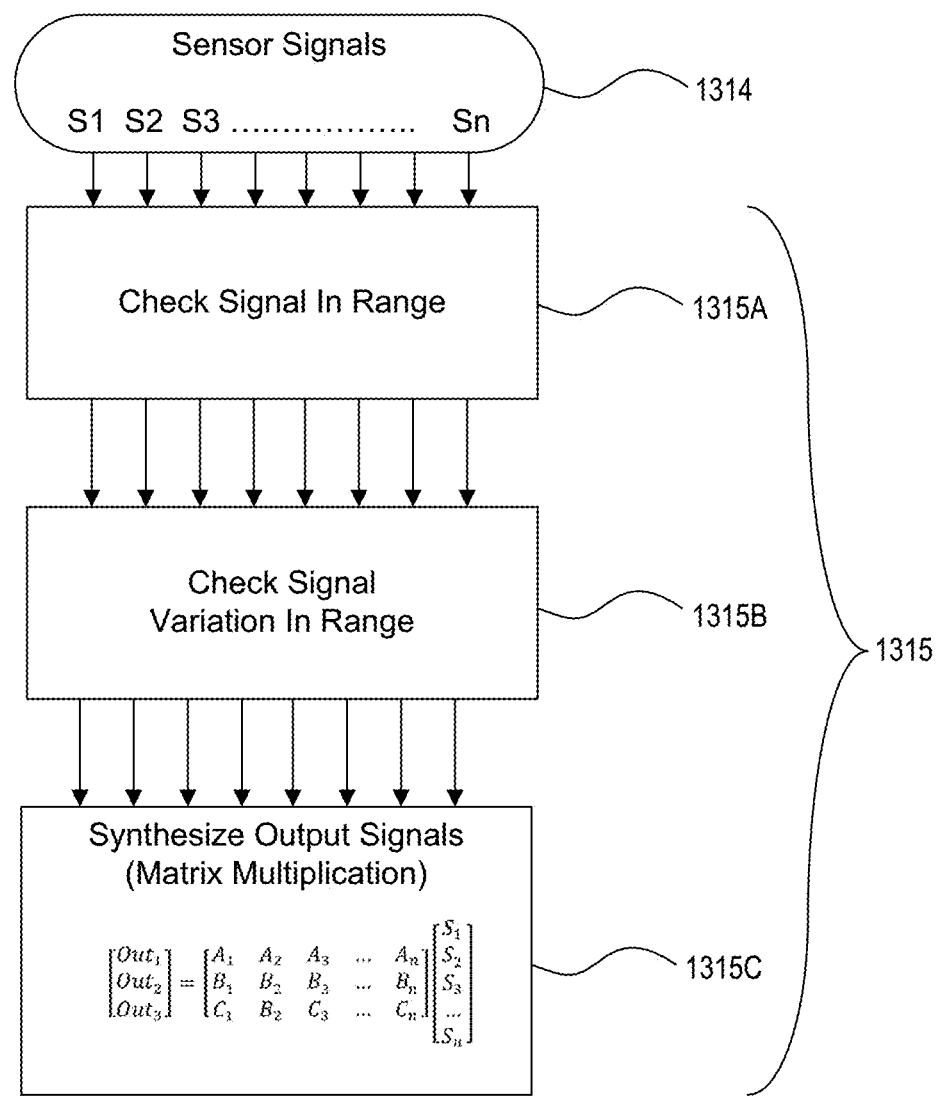
FIG. 13C is a schematic illustration of a method of generating a synthesized output signal in accordance with an embodiment.

Referring to the embodiment illustrated in FIG. 13C, in a more complex implementation, correlated sets of strain sensors may be checked for signal quality. As illustrated, feedback signals 1314 are received by a signal conditioning and combination logic 1315. At 1315A, the feedback signals 1314 are checked to determine if they are within a predefined normal operating range. Sensors (including gages 320, 340) that are outside of the normal operating range are flagged as failed sensors. Failed sensor signals may then be rejected requiring a change in the transformation matrix. At 1315B signals are checked for variation within the normal operating range. Sensors (including gages 320, 340) with variation that is greater or less than a normally operating sensor are flagged as failed sensors. Based on the sensors flagged as failed, a transformation matrix is selected that is able to synthesize the outputs from the remaining signals, and the transformation matrix is used to convert the resulting sensor signal vector into synthesized output signals (position measurement output) at 1315C. In this way synthesized output signals are maintained at a reduced signal to noise ratio rather than sensor failure causing output failure.

Figure 13D:
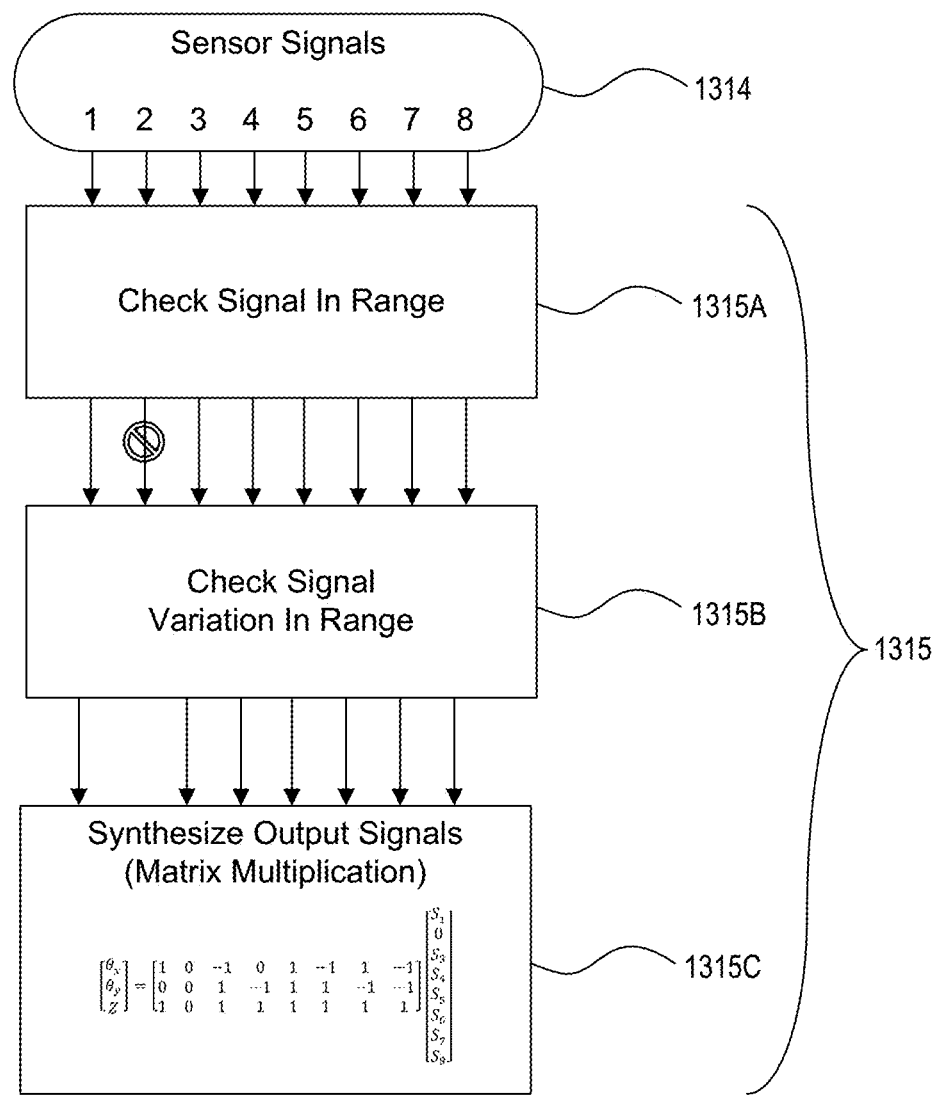
FIGS. 13D-13E are schematic illustrations of methods of generating synthesized output signals in accordance with embodiments.
Figure 13E:
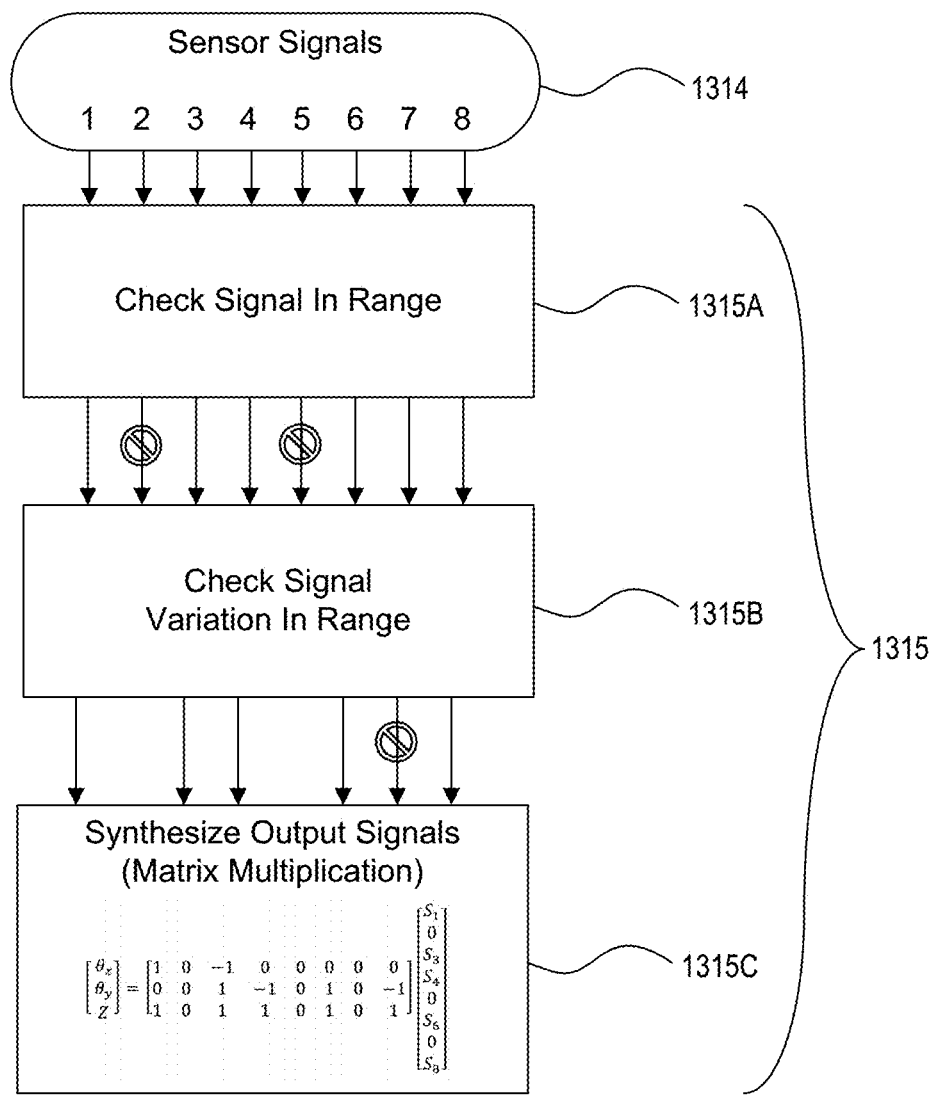

Examples of generating a synthesized output signal utilizing the 8 channel embodiment of FIG. 11F and the transformation matrix equation (1) are provided in FIGS. 13D-13E. It is to be appreciated that the following examples are provided for illustrational purposes, and that embodiments are not limited to the particular geometries or number of channels in the exemplary embodiments. Referring to FIG. 13D, at 1315A signal 2 is determined to read low (outside of the normal operation range) by the signal conditioning and combination logic 1315, and is flagged as a failed sensor. All remaining sensors are determined to be operating within normal variation in the operating range at 1315B. At 1315C, based on sensor 2 as being flagged as failed, a transformation matrix is selected and used to convert the resulting sensor signal vector into synthesized output signals (position measurement output). Referring to FIG. 13D, at 1315A signal 2 is determined to read low (outside of the normal operation range) and signal 5 is determined to read high (outside of the normal operation range) by the signal conditioning and combination logic 1315, and are flagged as failed sensors. At 1315B, signal 7 is determined to have variation that is lower than normal variation by the signal conditioning and combination logic 1315, and is flagged as a failed sensor. At 1315C, based on sensors 2, 5, and 7 as being flagged as failed, a transformation matrix is selected and used to convert the resulting sensor signal vector into synthesized output signals (position measurement output).

Figure 14:
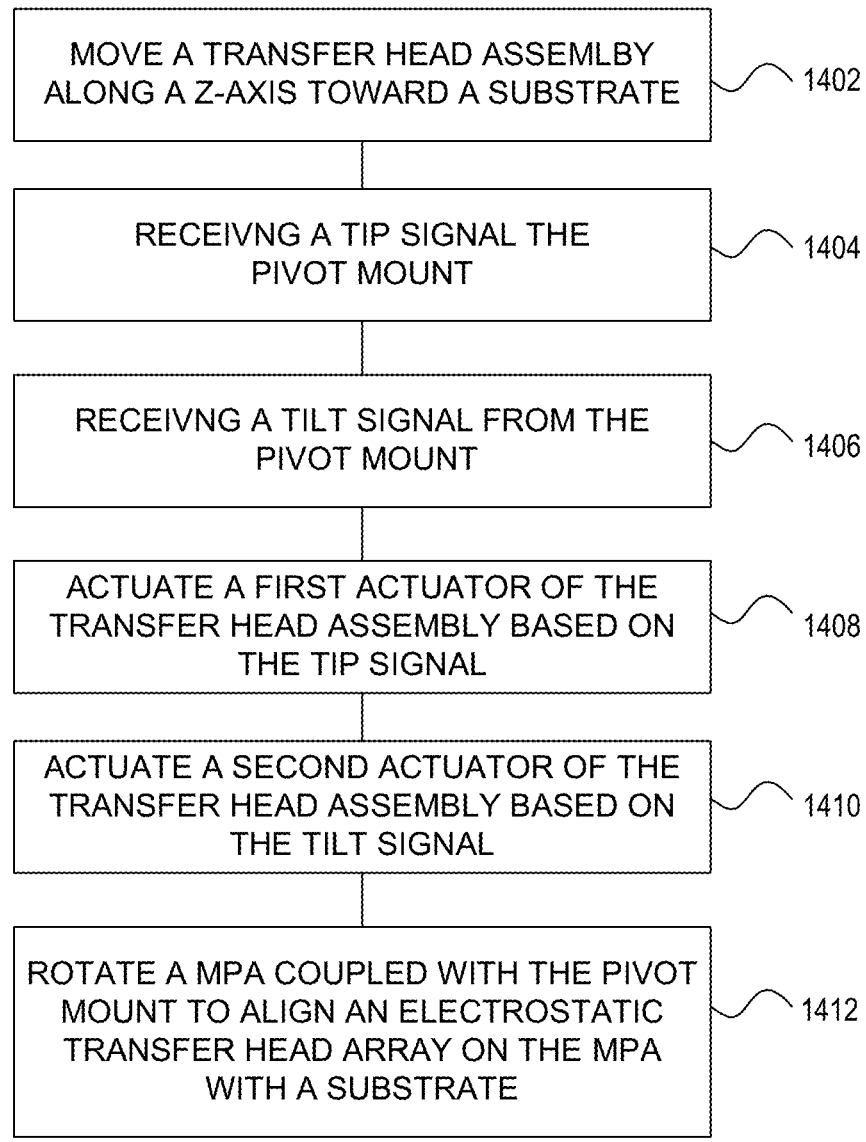
FIG. 14 is a flowchart illustrating a method of aligning a micro pick up array relative to a target substrate in accordance with an embodiment.

Referring to FIG. 14, a flowchart illustrating a method of aligning a MPA 103 coupled with a pivot mount 300 on a transfer head assembly 200 relative to a target substrate is shown in accordance with an embodiment. The method may be performed, e.g., during a pick-up or a placement operation as micro devices are transferred from a carrier substrate to a receiving substrate. At operation 1402, mass transfer tool 100 moves transfer head assembly 200 along a z-axis toward a target substrate, e.g., carrier substrate held by carrier substrate holder 104 or receiving substrate held by receiving substrate holder 106, according to primary input 1302. More specifically, the MPA 103 and pivot mount 300 are moved toward the target substrate along the z-axis. Movement of MPA 103 along z-axis 510 may be achieved by actuating various actuators of mass transfer tool 100 or a substrate holder.

Initially, there may be no compressive loading applied to MPA 103 or pivot mount 300. This initial state may correspond to a range of travel over which array of micro devices are physically separated from the electrostatic transfer head array. During this travel, MPA 103 and the target substrate may have misaligned surfaces, but there may be no indication of this misalignment since the pressure distribution state of pivot mount 300 may be uniform, i.e., all strain sensing elements may be outputting signals indicating zero strain.

At operations 1404 and 1406, an electrostatic transfer head in the electrostatic transfer head array 103 may contact a micro device while other electrostatic transfer heads may remain separated from corresponding micro devices. That is, contact may be made while MPA 103 is misaligned with the target substrate. This positional misalignment may be sensed as uneven pressure distribution in pivot mount 300. For example, a first strain output value from one strain sensing element 320 on pivot mount 300 and a different second strain output value from another strain sensing element 320 in pivot mount 300 may differ. The strain signals may be provided as feedback signals 1314 and conditioned and combined by into synthesized output signals (e.g. tip deflection, tilt deflection, and compression signals) by signal conditioning and combination logic 1315 indicating a contact disturbance 1312.

Dynamic enable control logic 1316 may observe that the contact disturbance 1312 exists, and depending upon the level of contact disturbance 1312, may activate actuator outer loops to determine driving signals for actuating various actuators of transfer head assembly 200 in order to adjust an orientation of MPA 103 such that pressure distribution across pivot mount 300 is uniform. For example, at operation 1408, in response to the tip signal being recognized as a contact disturbance 1312 above a threshold, x-actuator outer loop 1320 may feed command signals 1330 to x-actuator inner loop 1304 in order to actuate an x-actuator to tip MPA 103 about remote rotational center. Similarly, at operation 1410, in response to the tilt deflection signal being recognized as a contact disturbance 1312 above a threshold, y-actuator outer loop 1322 may feed command signals to y-actuator inner loop 1306 in order to actuate a y-actuator 708 to tile MPA 103 about remote rotational center.

At operation 1412, in response to actuation of the x- and y-actuators based on the tip and tilt deflection signals MPA 103 may be rotated into alignment with the target substrate. Furthermore, with remote rotational center co-located with the contact surface of MPA 103, the electrostatic transfer head array 115 may experience pure rotation about remote rotational center. Thus, as MPA 103 is aligned with the target substrate, the electrostatic transfer head array 115 may experience minimal parasitic lateral motion and micro devices may remain undamaged.

Actuation of transfer head assembly 200 according to synthesized output signals (tip, tilt, and z-compression signals) may continue until the electrostatic transfer head array 115 is in contact with micro devices on the target substrate. More particularly, actuation may continue until primary output 1310 is within the limits set by primary input 1302, at which point actuation may be stopped. As discussed above, primary output 1310 may be a positional output that is modified to reach a desired pivot mount 300 state. For example, actuation of transfer head assembly 200 may continue until primary positional input is achieved and/or pressure distribution across pivot mount 300 is uniform.

After contact between the electrostatic transfer head array 115 and the micro devices is made, a voltage may be applied to the electrostatic transfer head array 115 to create a grip pressure on the array of micro devices. An electrostatic voltage may be applied to electrostatic transfer head array 115 compliant voltage contacts 316 and voltage contacts 120. Additional electrical contacts and connectors may be integrated within transfer head assembly 200 and powered by voltage supplies based on control signals from computer 108. For example, computer 108 may implement a control algorithm instructing that electrostatic transfer head array 115 be activated if a predefined deformation is simultaneously sensed by each displacement sensor on pivot mount 300 during a pick up process. As a result, the array of electrostatic transfer head array 115 may apply a gripping pressure to the array of micro devices after the entire array surface is in contact and uniform pressure is applied across the array.

After gripping the micro devices with electrostatic transfer head array 115, the micro devices may be picked up from carrier substrate. During pick up, the electrostatic voltage supplied to the electrostatic transfer head array 115 may persist, and thus, the array of micro devices may be retained on the electrostatic transfer head array 115 and removed from the carrier substrate.

During the pick up operation, a heating element may direct heat toward pivot mount 300 and/or MPA 103. Thus, the micro devices may be heated through contact with electrostatic transfer head array 115 on MPA 103 during pick up. For example, a heating element adjacent to pivot mount 300 may be resistively heated to transfer heat to MPA 103, and thus, to the micro devices through the electrostatic transfer head array 115. Heat transfer may occur before, during, and after picking up the array of micro devices from carrier substrate.

Although a pick up process is described in relation to FIG. 14, a similar methodology may be used to control the placement of micro devices onto a receiving substrate, such as a display substrate, held by receiving substrate holder 106. For example, as the micro devices are gripped by the electrostatic transfer head array 115, mass transfer tool 100 may move the MPA 103 over a receiving substrate, and align MPA with a target region of the receiving substrate. MPA 103 may be advanced toward, and aligned with, the receiving substrate using the control sequence described above until the array of micro devices held by the electrostatic transfer head array 115 are placed in uniform contact with the target region. Uniform contact may be inferred by sensing a strain state of pivot mount 300. Subsequently, voltage may be removed from the electrostatic transfer head array 115 to release the micro devices onto the receiving substrate and complete the transfer operation.

Figure 15:
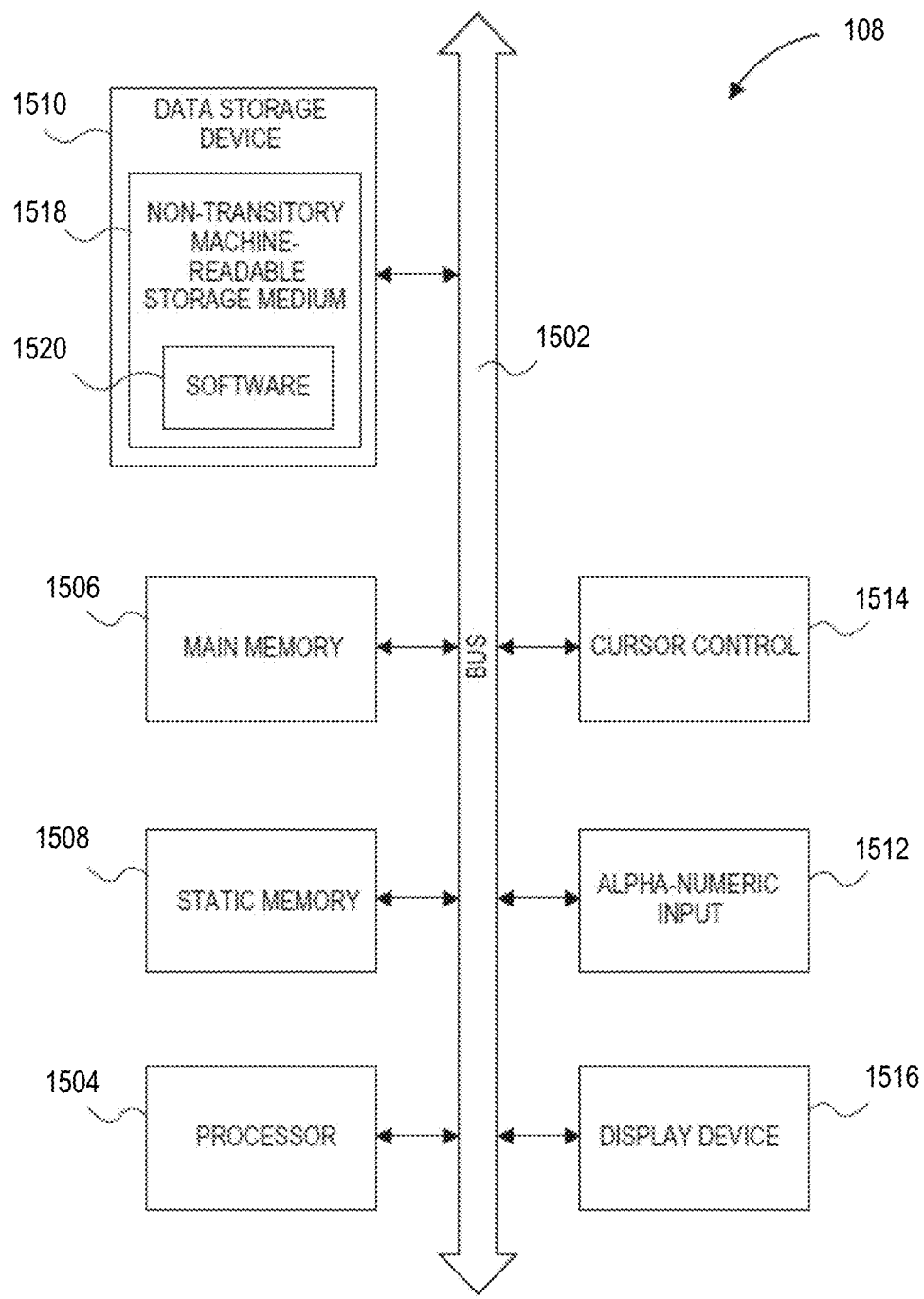
FIG. 15 is a schematic illustration of a computer system in accordance with an embodiment.

Referring to FIG. 15, a schematic illustration of a computer system is shown that may be used in accordance with an embodiment. Portions of embodiments of the invention are comprised of or controlled by non-transitory machine-readable and machine-executable instructions that reside, for example, in machine-usable media of a computer 108. Computer 108 is exemplary, and embodiments of the invention may operate on or within, or be controlled by a number of different computer systems including general purpose networked computer systems, embedded computer systems, routers, switches, server devices, client devices, various intermediate devices/nodes, stand-alone computer systems, and the like. Furthermore, although some components of a control system, e.g., signal conditioning and combination logic 1315 and dynamic control enable logic 1316, have been broken out for discussion separately above, computer 108 may integrate those components directly or include additional components that fulfill similar functions.

Computer 108 of FIG. 15 includes an address/data bus 1502 for communicating information, and a central processor 1504 coupled to bus 1502 for processing information and instructions. Computer 108 also includes data storage features such as a computer usable volatile memory, e.g. random access memory (RAM) 1506, coupled to bus 1502 for storing information and instructions for central processor 1504, computer usable non-volatile memory 1508, e.g. read only memory (ROM), coupled to bus 1502 for storing static information and instructions for the central processor 1504, and a data storage device 1510 (e.g., a magnetic or optical disk and disk drive) coupled to bus 1502 for storing information and instructions. Computer 108 of the present embodiment also includes an optional alphanumeric input device 1512 including alphanumeric and function keys coupled to bus 1502 for communicating information and command selections to central processor 1504. Computer 108 also optionally includes an optional cursor control 1514 device coupled to bus 1502 for communicating user input information and command selections to central processor 1504. Computer 108 of the present embodiment also includes an optional display device 1516 coupled to bus 1502 for displaying information.

The data storage device 1510 may include a non-transitory machine-readable storage medium 1518 on which is stored one or more sets of instructions (e.g. software 1520) embodying any one or more of the methodologies or operations described herein. For example, software 1520 may include instructions, which when executed by processor 1504, cause computer 108 to control mass transfer tool 100 or remote center robot 500 according to the control scheme described above for aligning an MPA 103 with a target substrate. Software 1520 may also reside, completely or at least partially, within the volatile memory, non-volatile memory 1508, and/or within processor 1504 during execution thereof by computer 108, volatile memory 1506, non-volatile memory 1508, and processor 1504 also constituting non-transitory machine-readable storage media.

In utilizing the various aspects of this invention, it would become apparent to one skilled in the art that combinations or variations of the above embodiments are possible for forming a pivot mount with integrated strain sensing elements and/or compliant voltage contacts. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A pivot mount comprising:
   a pivot platform;
   a base;
   a plurality of spring arms, each spring arm fixed to the pivot platform at a corresponding inner root, and fixed to the base at a corresponding outer root;
   wherein each spring arm includes:
      a switch-back along an axial length of the spring arm such that a pair of first and second lengths of the spring arm immediately adjacent the switch-back are parallel to each other;
      a first strain sensing element at the first length; and
      a second strain sensing element at the second length.

2. The pivot mount of claim 1, wherein the switch-back is an inner switch-back along an inner length of the spring arm, and further comprising an outer switch-back along an outer length of the spring arm.

3. The pivot mount of claim 1, further comprising a first reference gage adjacent the first strain sensing element at the first length.

4. The pivot mount of claim 3, further comprising a second reference gage adjacent the second strain sensing element at the second length.

5. The pivot mount of claim 1, wherein the plurality of spring arms comprises three or more spring arms.

6. The pivot mount of claim 5, wherein the switch-back is an inner switch-back along an inner length of the spring arm, and further comprising an outer switch-back along an outer length of the spring arm.

7. The pivot mount of claim 1, wherein the inner root is perpendicular to an inner length of the spring arm extending from the pivot platform, and the outer root is perpendicular to an outer length of the spring arm extending from the base.

8. The pivot mount of claim 1, wherein the pivot platform is movable relative to the base in a direction orthogonal to a contact surface of the pivot platform, wherein movement of the pivot platform in the direction orthogonal to the contact surface of the pivot platform causes a normal strain that is characterized as being parallel to the axial length of the spring arm at the first and second lengths of the spring arm.

9. The pivot mount of claim 8, wherein the normal strain comprises opposite sign on the first and second lengths of the spring arm.

10. The pivot mount of claim 1, wherein the first and second strain sensing elements are strain gages.

11. The pivot mount of claim 10, wherein the strain gages are bonded to the spring arm, deposited on the spring arm, or doped regions in the spring arm.

12. A pivot mount comprising:
   a pivot platform including a plurality of compliant voltage contacts;
   a clamping electrode on the pivot platform, wherein each compliant voltage contact protrudes from the pivot platform such that they are elevated above the pivot platform and the clamping electrode;
   a base; and
   a plurality of spring arms, each spring arm fixed to the pivot platform at a corresponding inner root, and fixed to the base at a corresponding outer root.

13. The pivot mount of claim 12, wherein each compliant voltage contact comprises a channel extending through the pivot platform.

14. The pivot mount of claim 13, wherein the channel for each compliant voltage contact is characterized as a winding contour or switch-back.

15. A transfer tool comprising:
   an articulating transfer head assembly;
   a pivot mount, mountable onto the articulating transfer head assembly comprising:
      a pivot platform;
      a base;
      a plurality of spring arms, each spring arm fixed to the pivot platform at a corresponding inner root, and fixed to the base at a corresponding outer root;
      wherein each spring arm includes:
         a switch-back along an axial length of the spring arm such that a pair of first and second lengths of the spring arm immediately adjacent the switch-back are parallel to each other;
         a first strain sensing element at the first length;
         a second strain sensing element at the second length; and
   a micro pick up array mountable onto the pivot platform of the pivot mount, the micro pick up array including an array of electrostatic transfer heads.

16. The transfer tool of claim 15, wherein the pivot platform comprises a plurality of compliant voltage contacts.

17. The transfer tool of claim 16, wherein the micro pick up array comprises a plurality of voltage contacts arranged to mate with the plurality of compliant voltage contacts of the pivot platform.

18. The transfer tool of claim 15, wherein each electrostatic transfer head has a localized contact point characterized by a maximum dimension of 1-100 μm in both x- and y-dimensions.

* * * * *